US011446924B2

(12) United States Patent
Yamada

(10) Patent No.: US 11,446,924 B2
(45) Date of Patent: Sep. 20, 2022

(54) LIQUID EJECTING APPARATUS, DRIVE CIRCUIT, AND INTEGRATED CIRCUIT

(71) Applicant: SEIKO EPSON CORPORATION, Tokyo (JP)

(72) Inventor: Tomokazu Yamada, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 17/133,804

(22) Filed: Dec. 24, 2020

(65) Prior Publication Data

US 2021/0197554 A1 Jul. 1, 2021

(30) Foreign Application Priority Data

Dec. 26, 2019 (JP) .............................. JP2019-236570

(51) Int. Cl.
*B41J 2/045* (2006.01)
*B41J 2/14* (2006.01)

(52) U.S. Cl.
CPC ....... *B41J 2/04541* (2013.01); *B41J 2/04581* (2013.01); *B41J 2/04588* (2013.01)

(58) Field of Classification Search
CPC .................................................. B41J 2/04581
See application file for complete search history.

(56) References Cited

U.S. PATENT DOCUMENTS

| 2007/0165074 | A1 | 7/2007 | Ishizaki | |
| 2016/0144617 | A1* | 5/2016 | Yamada | B41J 2/14233 327/111 |
| 2016/0167366 | A1* | 6/2016 | Shima | H02M 1/088 323/282 |
| 2016/0167372 | A1* | 6/2016 | Yamada | B41J 2/04581 327/111 |
| 2017/0057221 | A1 | 3/2017 | Nozawa | |
| 2017/0111042 | A1* | 4/2017 | Yamada | B41J 2/04593 |
| 2019/0291416 | A1 | 9/2019 | Takagi | |
| 2019/0291422 | A1 | 9/2019 | Takagi | |

FOREIGN PATENT DOCUMENTS

JP 2019-162843 A 9/2019

* cited by examiner

*Primary Examiner* — Shelby L Fidler

(74) *Attorney, Agent, or Firm* — Global IP Counselors, LLP

(57) ABSTRACT

A liquid ejecting apparatus includes an integrated circuit, and a feedback circuit that feeds back a feedback signal. The integrated circuit includes a modulation circuit that output a modulation signal, a constant voltage output circuit that outputs a DC voltage signal, and an input terminal to which the feedback signal is input. The modulation circuit and the constant voltage output circuit are electrically coupled to the input terminal, a first line segment located between the input terminal and the constant voltage output circuit in a first straight line connecting the input terminal and the constant voltage output circuit at a shortest distance does not intersect the modulation circuit, and a second line segment located between the input terminal and the modulation circuit in a second straight line connecting the input terminal and the modulation circuit at a shortest distance does not intersect the constant voltage output circuit.

7 Claims, 14 Drawing Sheets

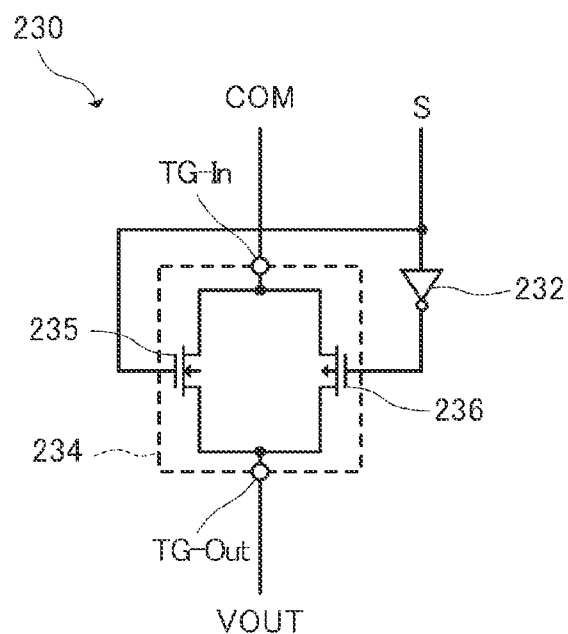

LIQUID EJECTING APPARATUS, DRIVE
CIRCUIT, AND INTEGRATED CIRCUIT

The present application is based on, and claims priority from JP Application Serial Number 2019-236570, filed Dec. 26, 2019, the disclosure of which is hereby incorporated by reference herein in its entirety.

BACKGROUND

1. Technical Field

The present disclosure relates to a liquid ejecting apparatus, a drive circuit, and an integrated circuit.

2. Related Art

As an example of a liquid ejecting apparatus that ejects a liquid such as ink to print an image or a document, ink jet printers that use a piezoelectric element such as a piezo element are known. Such a piezoelectric element is provided corresponding to a plurality of nozzles for ejecting ink in a print head. Then, the liquid ejecting apparatus including the piezoelectric element ejects a predetermined amount of ink from the nozzle corresponding to the piezoelectric element at a predetermined timing by operating the piezoelectric element according to a drive signal. As a result, the liquid ejecting apparatus forms dots of any size at any position of a medium.

JP-A-2019-162843 discloses a drive circuit (a drive signal generation circuit) and a liquid ejecting apparatus including the drive circuit, in which the drive circuit outputs a drive signal for operating a piezoelectric element that is a capacitive load, and includes an integrated circuit including a modulation circuit that modulates a base drive signal that is the basis of the drive signal, and an output circuit that outputs the drive signal based on an output from the integrated circuit.

The integrated circuit in the drive circuit described in JP-A-2019-162843 includes, in addition to the circuit for generating the drive signal for driving the piezoelectric element, a discharge circuit that discharges a charge based on the drive signal in order to protect the piezoelectric element and an ejection portion including the piezoelectric element. In the integrated circuit having such a plurality of functions, malfunction may occur depending on the arrangement of each circuit and terminal. However, since the liquid ejecting apparatus described in JP-A-2019-162843 does not disclose the arrangement of each circuit or terminal inside the integrated circuit in the drive circuit, there is room for improvement in terms of the circuit arrangement inside the integrated circuit for stabilizing the operation of the integrated circuit.

SUMMARY

According to an aspect of the present disclosure, there is provided a liquid ejecting apparatus including a liquid ejecting head having a drive element, and ejecting a liquid by supplying a drive signal to the drive element, and a drive circuit that outputs the drive signal. The drive circuit includes an integrated circuit that outputs an amplification control signal based on a base drive signal, an amplifier circuit that operates according to the amplification control signal to output an amplified modulation signal, a demodulation circuit that demodulates the amplified modulation signal to output the drive signal, and a feedback circuit that feeds back a feedback signal based on the drive signal to the integrated circuit. The integrated circuit includes a modulation circuit that modulates the base drive signal to output a modulation signal, a switching circuit that outputs the amplification control signal according to the modulation signal, a constant voltage output circuit that outputs a DC voltage signal, and an input terminal to which the feedback signal is input. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

According to another aspect of the present disclosure, there is provided a drive circuit that outputs a drive signal for driving a capacitive load. The drive circuit includes an integrated circuit that outputs an amplification control signal based on a base drive signal, an amplifier circuit that operates according to the amplification control signal to output an amplified modulation signal, a demodulation circuit that demodulates the amplified modulation signal to output the drive signal, and a feedback circuit that feeds back a feedback signal based on the drive signal to the integrated circuit. The integrated circuit includes a modulation circuit that modulates the base drive signal to output a modulation signal, a switching circuit that outputs the amplification control signal according to the modulation signal, an input terminal to which the feedback signal is input, and a constant voltage output circuit that outputs a DC voltage signal. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

According to still another aspect of the present disclosure, there is provided an integrated circuit used in a drive circuit that outputs a drive signal for driving a capacitive load. The integrated circuit includes a modulation circuit that modulates a base drive signal to output a modulation signal, a switching circuit that outputs an amplification control signal according to the modulation signal, an input terminal to which a feedback signal based on the drive signal is input, and a constant voltage output circuit that outputs a DC voltage signal. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

BRIEF DESCRIPTION OF THE DRAWINGS

FIG. 5 is a diagram illustrating an electrical configuration of a selection circuit.

FIG. 6 is a diagram illustrating an example of decoding contents in a decoder.

DESCRIPTION OF EXEMPLARY EMBODIMENTS

Hereinafter, preferred embodiments of the present disclosure will be described with reference to the drawings. The drawings used are for convenience of description. The embodiments to be described below do not unduly limit the contents of the present disclosure described in the scope of claims. In addition, all of the configurations to be described below are not necessarily essential configuration requirements of the present disclosure.

1. Configuration of Liquid Ejecting Apparatus

A printing apparatus as an example of a liquid ejecting apparatus according to the present embodiment is an ink jet printer that prints an image including characters, figures, and the like according to image data on a medium such as paper by ejecting ink from a nozzle according to the image data input from an external host computer or the like.

Figure 1:
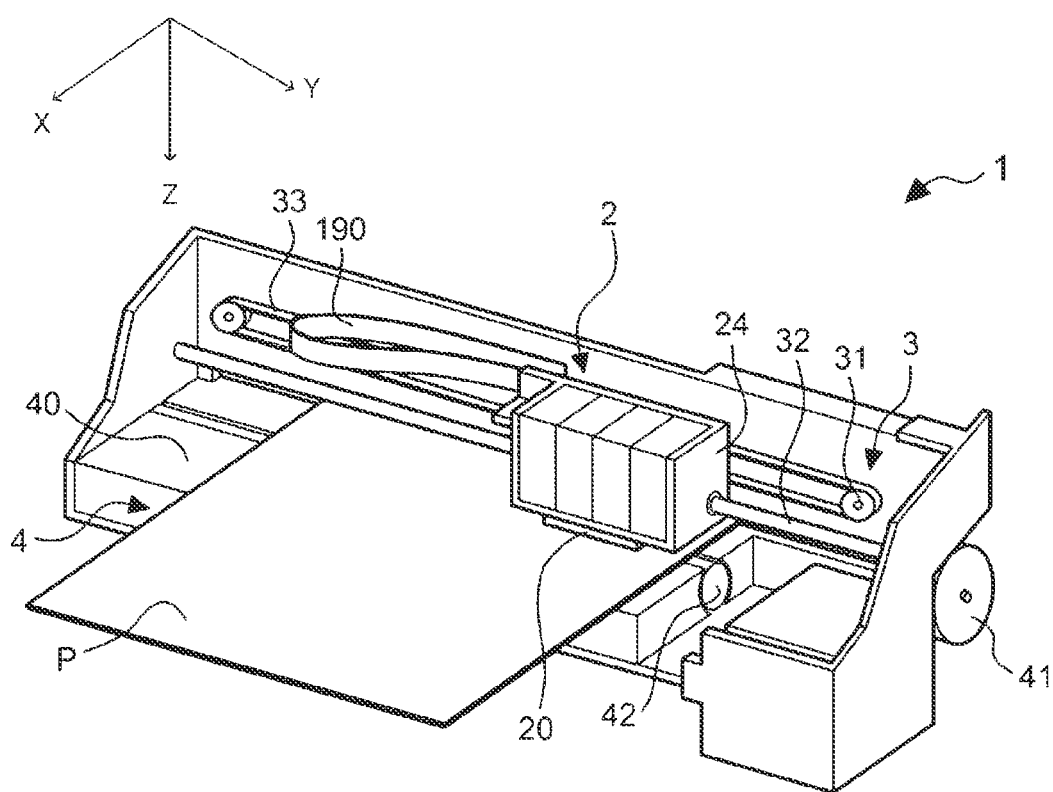
FIG. 1 is a diagram illustrating a configuration example of a liquid ejecting apparatus.

FIG. 1 is a diagram illustrating a configuration example of a liquid ejecting apparatus 1. FIG. 1 illustrates a direction X in which a medium P is transported, a direction Y in which a moving object 2 reciprocates while intersecting the direction X, and a direction Z in which ink is ejected. In the description below, the direction X, the direction Y, and the direction Z are described as being orthogonal to each other, but the configurations included in the liquid ejecting apparatus 1 are not limited to being arranged to be orthogonal to each other. In the following description, the direction Y in which the moving object 2 moves may be referred to as a main scanning direction.

As illustrated in FIG. 1, the liquid ejecting apparatus 1 includes the moving object 2 and a moving mechanism 3 that reciprocates the moving object 2 in the direction Y. The moving mechanism 3 has a carriage motor 31 that is a drive source of the moving object 2, a carriage guide shaft 32 having both ends fixed, and a timing belt 33 that extends substantially parallel to the carriage guide shaft 32 and is driven by the carriage motor 31.

A carriage 24 included in the moving object 2 is reciprocally supported by the carriage guide shaft 32 and fixed to a part of the timing belt 33. Then, the carriage 24 is guided by the carriage guide shaft 32 and reciprocates in the direction Y by driving the timing belt 33 with the carriage motor 31. A head unit 20 having a large number of nozzles is provided in a portion of the moving object 2 facing the medium P. A control signal or the like is input to the head unit 20 via a cable 190. Then, the head unit 20 ejects ink as an example of liquid from the nozzle based on the input control signal.

The liquid ejecting apparatus 1 includes a transport mechanism 4 that transports the medium P on a platen 40 in the direction X. The transport mechanism 4 includes a transport motor 41 that is a drive source, and a transport roller 42 that is rotated by the transport motor 41 and transports the medium P in the direction X.

In the liquid ejecting apparatus 1 configured as described above, when ink is ejected from the head unit 20 at the timing when the medium P is transported by the transport mechanism 4, the ink lands on a desired position on the medium P, as a result, an image is formed on the surface of the medium P.

2. Electrical Configuration of Liquid Ejecting Apparatus

Figure 2:
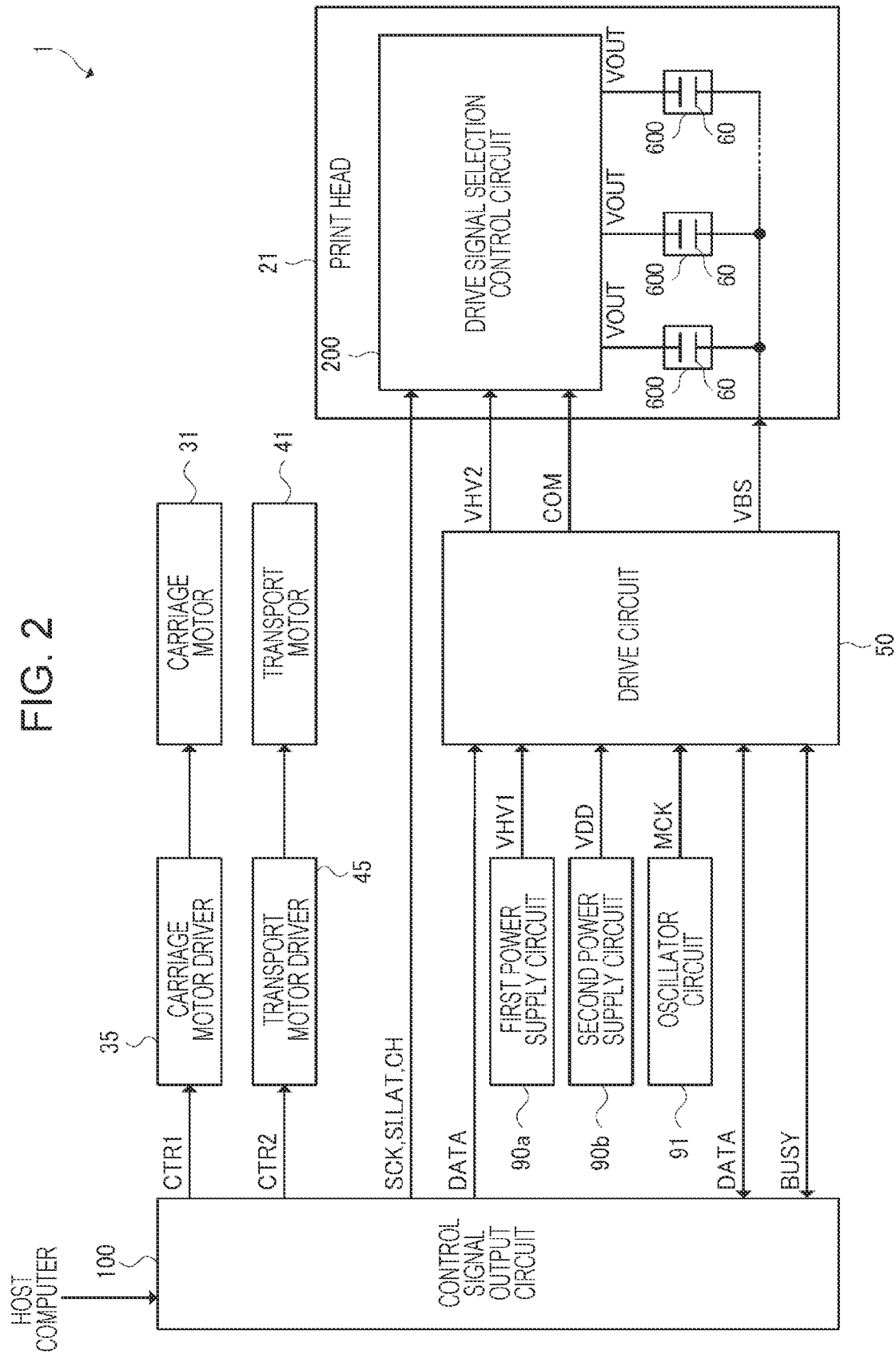
FIG. 2 is a diagram illustrating a functional configuration of the liquid ejecting apparatus.

FIG. 2 is a diagram illustrating a functional configuration of the liquid ejecting apparatus 1. As illustrated in FIG. 2, the liquid ejecting apparatus 1 has a control signal output circuit 100, a carriage motor driver 35, the carriage motor 31, a transport motor driver 45, the transport motor 41, a drive circuit 50, a first power supply circuit 90a, a second power supply circuit 90b, an oscillator circuit 91, and a print head 21.

The control signal output circuit 100 generates a plurality of control signals for controlling various configurations based on image data input from a host computer, and outputs the control signals to the corresponding configurations. Specifically, the control signal output circuit 100 generates a control signal CTR1, and outputs the control signal to the carriage motor driver 35. The carriage motor driver 35 drives the carriage motor 31 according to the input control signal CTR1. Thereby, the movement of the carriage 24 in the direction along the direction Y is controlled. The control signal output circuit 100 generates a control signal CTR2, and outputs the control signal to the transport motor driver 45. The transport motor driver 45 drives the transport motor 41 according to the input control signal CTR2. Thereby, the transportation of the medium P in the direction along the direction X is controlled.

Further, the control signal output circuit 100 generates a drive data signal DATA for controlling the operation of the drive circuit 50, and outputs the drive data signal to the drive circuit 50. The control signal output circuit 100 generates a clock signal SCK, a print data signal SI, a latch signal LAT, and a change signal CH for controlling the operation of the print head 21, and outputs the signals to the print head 21.

The first power supply circuit 90a generates a voltage signal VHV1 having a voltage value of DC 42 V, for example. Then, the first power supply circuit 90a outputs the voltage signal VHV1 to the drive circuit 50. The second power supply circuit 90b generates a voltage signal VDD having a voltage value of DC 3.3 V, for example. Then, the second power supply circuit 90b outputs the voltage signal VDD to the drive circuit 50. The voltage signals VHV1 and VDD may be supplied to each portion in the liquid ejecting apparatus 1. Further, the first power supply circuit 90a and the second power supply circuit 90b may generate a signal having a voltage value different from the voltage signal VHV1 and the voltage signal VDD having the voltage values described above.

The oscillator circuit 91 generates a clock signal MCK and outputs the clock signal to the drive circuit 50. Here, the oscillator circuit 91 may be provided independently of the control signal output circuit 100 as illustrated in FIG. 2, or may be provided inside the control signal output circuit 100. Further, the clock signal MCK output from the oscillator circuit 91 may be supplied to each portion in the liquid ejecting apparatus 1 in addition to the drive circuit 50.

The drive circuit 50 amplifies a signal having a waveform defined by the drive data signal DATA based on the voltage signal VHV1 to generate a drive signal COM, and outputs the drive signal to the print head 21. The drive circuit 50 also generates a reference voltage signal VBS, which is a reference potential of a piezoelectric element 60 in the print head 21, and outputs the reference voltage signal to the print head 21. Further, the drive circuit 50 propagates the voltage signal VHV1 input from the first power supply circuit 90a and outputs the voltage signal VHV1 as a voltage signal VHV2. Here, the voltage value of the reference voltage signal VBS which is the reference potential of the piezoelectric element 60 may be, for example, DC 6 V, DC 5.5 V, or the like, or may be a ground potential. The details of the configuration and operation of the drive circuit 50 will be described later.

The print head 21 has a drive signal selection control circuit 200 and a plurality of ejection portions 600. Further, each ejection portion 600 includes the piezoelectric element 60. The clock signal SCK, the print data signal SI, the latch signal LAT, the change signal CH, the drive signal COM, and the voltage signal VHV2 are input to the drive signal selection control circuit 200. Then, the drive signal selection control circuit 200 selects or deselects the drive signal COM based on the clock signal SCK, the print data signal SI, the latch signal LAT, the change signal CH, and the voltage signal VHV2 to generate a drive signal VOUT, and outputs the drive signal VOUT to each ejection portion 600.

The drive signal VOUT is supplied to one end of the piezoelectric element 60 included in each of the plurality of ejection portions 600. The reference voltage signal VBS is supplied to the other end of the piezoelectric element 60. Then, the piezoelectric element 60 is driven by a potential difference between the drive signal VOUT and the reference voltage signal VBS. Thereby, ink is ejected from the ejection portion 600.

The print head 21 configured as described above is included in the head unit 20. Here, the piezoelectric element 60 is an example of a drive element, and the print head 21 that has the piezoelectric element 60 and ejects ink by supplying the drive signal VOUT to the piezoelectric element 60 is an example of a liquid ejecting head.

3. Configuration and Operation of Liquid Ejecting Head

Next, the configuration and operation of the drive signal selection control circuit 200 will be described. Before describing the configuration and operation of the drive signal selection control circuit 200, an example of the waveform of the drive signal COM input to the drive signal selection control circuit 200 will be described first with reference to FIG. 3. Thereafter, the configuration and operation of the drive signal selection control circuit 200 will be described with reference to FIGS. 4 to 7.

Figure 3:
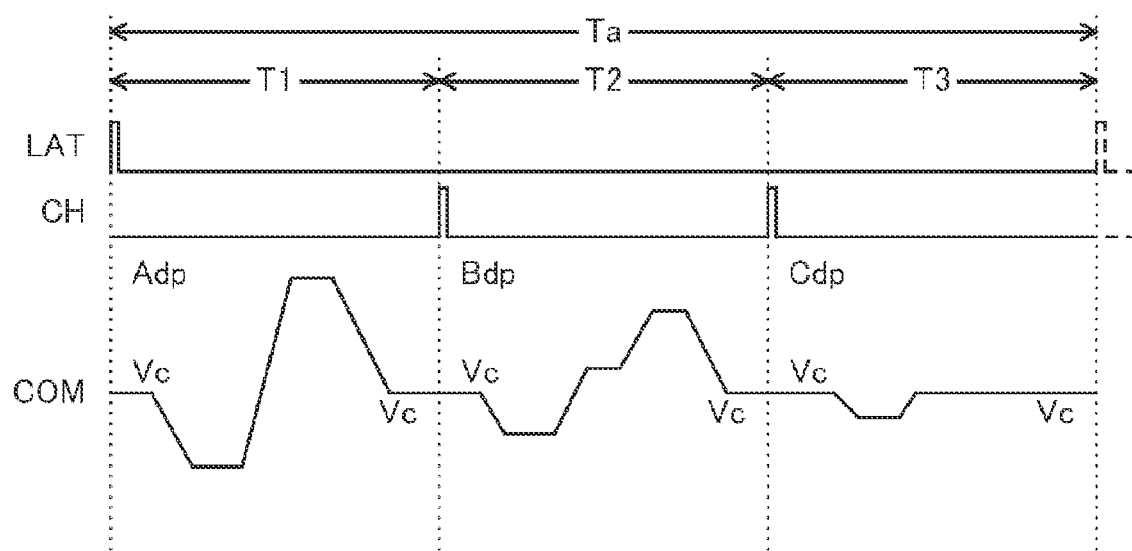
FIG. 3 is a diagram illustrating an example of a waveform of a drive signal.

FIG. 3 is a diagram illustrating an example of a waveform of a drive signal COM. FIG. 3 illustrates a period T1 from the rise of the latch signal LAT to the rise of the change signal CH, a period T2 after the period T1 until the next change signal CH rises, and a period T3 after the period T2 until the latch signal LAT rises. A cycle Ta composed of the periods T1, T2 and T3 corresponds to a print cycle for forming new dots on the medium P. That is, the latch signal LAT is a signal that defines the print cycle in which new dots are formed on the medium P, and the change signal CH is a signal that defines the switching timing of the waveform included in the drive signal COM.

As illustrated in FIG. 3, the drive circuit 50 generates a trapezoidal waveform Adp in the period T1. When the trapezoidal waveform Adp is supplied to the piezoelectric element 60, a predetermined amount, specifically, a medium amount of ink is ejected from the corresponding ejection portion 600. The drive circuit 50 generates a trapezoidal waveform Bdp in the period T2. When the trapezoidal waveform Bdp is supplied to the piezoelectric element 60, a small amount of ink smaller than the predetermined amount is ejected from the corresponding ejection portion 600. The drive circuit 50 generates a trapezoidal waveform Cdp in the period T3. When the trapezoidal waveform Cdp is supplied to the piezoelectric element 60, the piezoelectric element 60 is driven to the extent that ink is not ejected from the corresponding ejection portion 600. Therefore, when the trapezoidal waveform Cdp is supplied to the piezoelectric element 60, dots are not formed on the medium P. The trapezoidal waveform Cdp is a waveform for preventing the viscosity of the ink from increasing by slightly vibrating the ink in the vicinity of the nozzle opening of the ejection portion 600. In the following description, driving the piezoelectric element 60 to the extent that the ink is not ejected from the ejection portion 600 in order to prevent the viscosity of the ink from increasing may be referred to as a "slight vibration".

Here, both the voltage value at the start timing and the voltage value at the end timing of each of the trapezoidal waveform Adp, the trapezoidal waveform Bdp, and the trapezoidal waveform Cdp are common to a voltage Vc. That is, the trapezoidal waveforms Adp, Bdp, and Cdp are waveforms whose voltage value starts at the voltage Vc and ends at the voltage Vc. As described above, the drive circuit 50 outputs the drive signal COM having a waveform in which the trapezoidal waveforms Adp, Bdp, and Cdp are continuous in the cycle Ta. The waveform of the drive signal COM illustrated in FIG. 3 is an example, and the present disclosure is not limited thereto.

Figure 4:
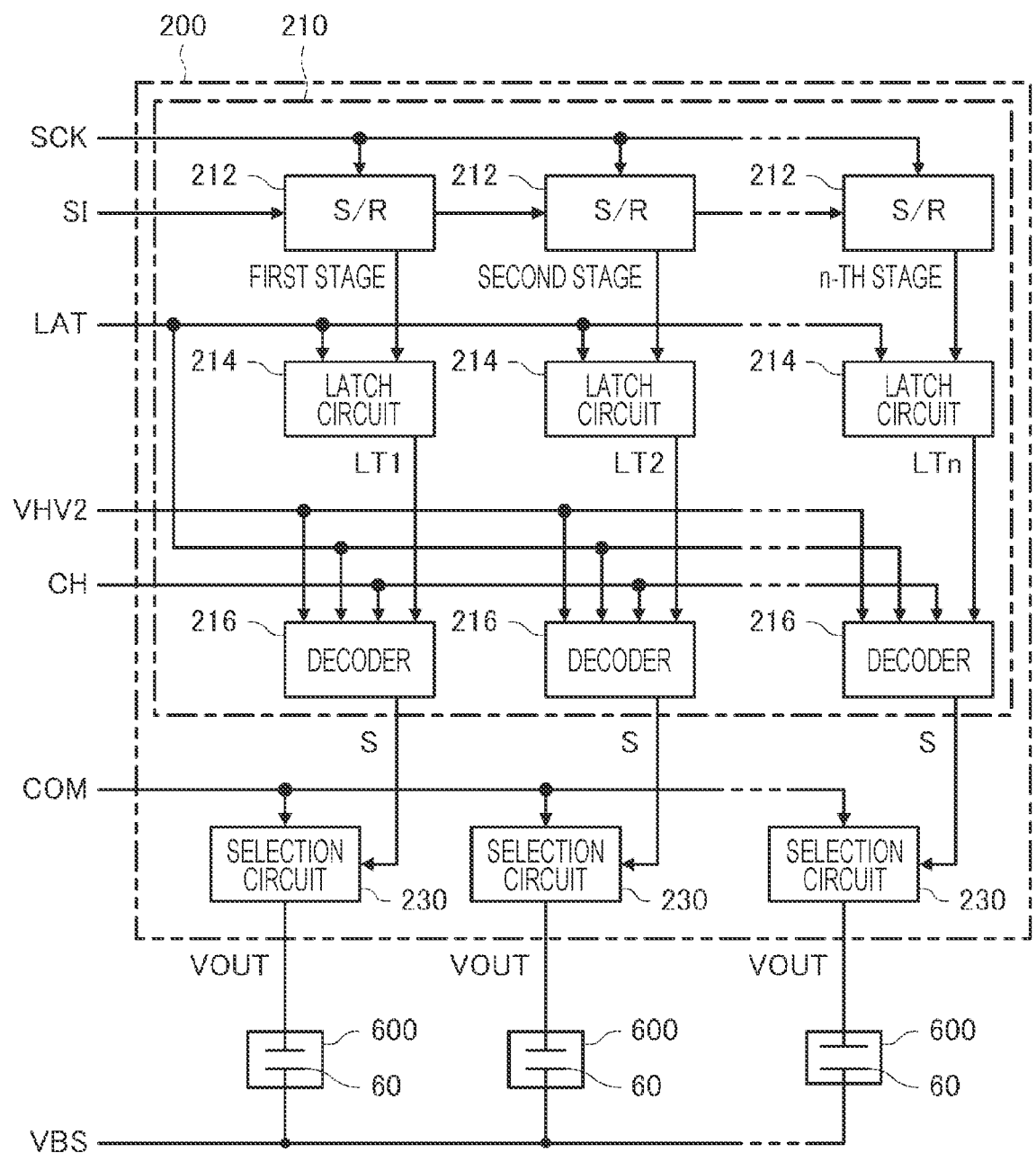
FIG. 4 is a diagram illustrating a functional configuration of a drive signal selection control circuit.

FIG. 4 is a diagram illustrating a functional configuration of the drive signal selection control circuit 200. The drive signal selection control circuit 200 switches whether or not to select the trapezoidal waveforms Adp, Bdp, and Cdp included in the drive signal COM in each of the periods T1, T2, and T3, thereby generating and outputting the drive signal VOUT supplied to the piezoelectric element 60 in the cycle Ta.

As illustrated in FIG. 4, the drive signal selection control circuit 200 includes a selection control circuit 210 and a plurality of selection circuits 230. The clock signal SCK, the print data signal SI, the latch signal LAT, the change signal CH, and the voltage signal VHV2 are supplied to the selection control circuit 210. In the selection control circuit 210, a set of a shift register (S/R) 212, a latch circuit 214, and a decoder 216 is provided corresponding to each of the ejection portions 600. That is, the print head 21 is provided with the same number of sets of the shift registers 212, the latch circuits 214, and the decoders 216 as the n ejection portions 600.

The shift register 212 temporarily holds 2-bit print data [SIH, SIL] included in the print data signal SI for each corresponding ejection portion 600. More specifically, the shift registers 212 having the number of stages corresponding to the ejection portion 600 are coupled in cascade, and the print data signal SI serially supplied is sequentially transferred to the subsequent stage according to the clock signal SCK. Then, when the supply of the clock signal SCK is stopped, the 2-bit print data [SIH, SIL] corresponding to each ejection portion 600 is held in each shift register 212. In FIG. 4, in order to distinguish the shift registers 212, a first stage, a second stage, . . . , an n-th stage are sequentially shown from the upstream to which the print data signal SI is supplied.

Each of the n latch circuits 214 latches the print data [SIH, SIL] held in the corresponding shift register 212 at the rising edge of the latch signal LAT. Each of the n decoders 216 decodes the 2-bit print data [SIH, SIL] latched by the corresponding latch circuit 214 to generate a selection signal S, and supplies the selection signal to the selection circuit 230.

The selection circuit 230 is provided corresponding to each of the ejection portions 600. That is, the number of selection circuits 230 in one print head 21 is the same as the number of the n ejection portions 600 included in the print head 21. Then, the selection circuit 230 controls the supply of the drive signal COM to the piezoelectric element 60 based on the selection signal S supplied from the decoder 216.

FIG. 5 is a diagram illustrating an electrical configuration of the selection circuit 230 corresponding to one ejection portion 600. As illustrated in FIG. 5, the selection circuit 230 has an inverter 232 and a transfer gate 234. The transfer gate 234 includes a transistor 235 which is an NMOS transistor and a transistor 236 which is a PMOS transistor.

The selection signal S is supplied from the decoder 216 to a gate terminal of the transistor 235. Further, the selection signal S is logically inverted by the inverter 232 and is also supplied to a gate terminal of the transistor 236. A drain terminal of the transistor 235 and a source terminal of the transistor 236 are electrically coupled to a terminal TG-In of the transfer gate 234. The drive signal COM is input to the terminal TG-In of the transfer gate 234. That is, the terminal TG-In of the transfer gate 234 is electrically coupled to the drive circuit 50. Then, the transistor 235 and the transistor 236 are controlled to be conductive or non-conductive according to the selection signal S, so that the drive signal VOUT is output from a terminal TG-Out of the transfer gate 234 to which a source terminal of the transistor 235 and a drain terminal of the transistor 236 are commonly coupled. The terminal TG-Out of the transfer gate 234 from which the drive signal VOUT is output is electrically coupled to an electrode 611 of the piezoelectric element 60, which will be described later.

Next, decoding contents of the decoder 216 will be described with reference to FIG. 6. FIG. 6 is a diagram illustrating an example of decoding contents in the decoder 216. The 2-bit print data [SIH, SIL], the latch signal LAT, and the change signal CH are input to the decoder 216. Then, for example, when the print data [SIH, SIL] is [1, 0] defining a "medium dot", the decoder 216 outputs the selection signal S which becomes H level, L level, and L level in the periods T1, T2, and T3. Here, a logic level of the selection signal S is level-shifted to a high-amplitude logic based on the voltage signal VHV2 by a level shifter (not illustrated).

Figure 7:
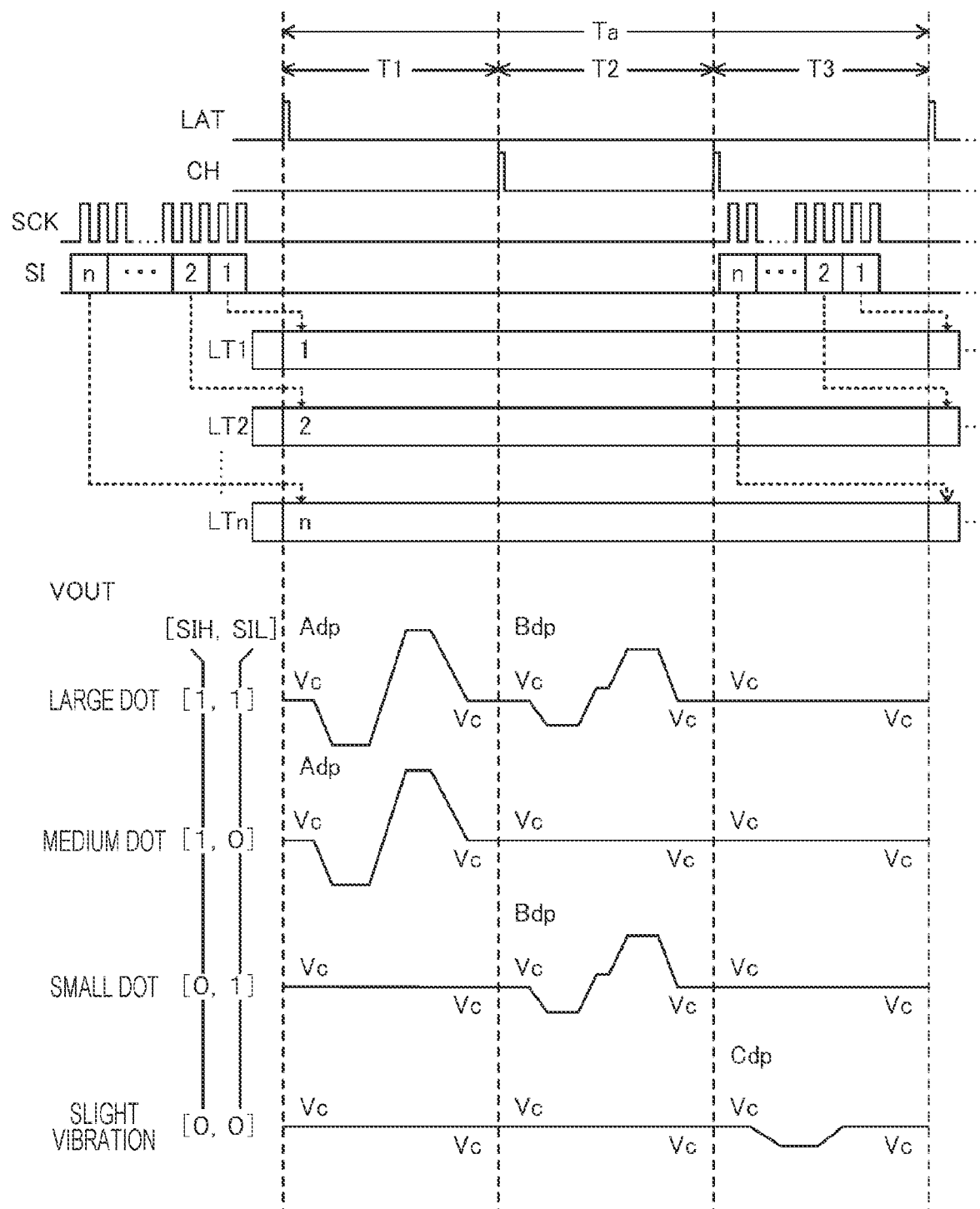
FIG. 7 is a diagram for describing the operation of the drive signal selection control circuit.

FIG. 7 is a diagram for describing the operation of the drive signal selection control circuit 200. As illustrated in FIG. 7, the print data [SIH, SIL] included in the print data signal SI is serially supplied to the drive signal selection control circuit 200 in synchronization with the clock signal SCK, and sequentially transferred in the shift register 212 corresponding to the ejection portion 600. Then, when the supply of the clock signal SCK is stopped, the print data [SIH, SIL] corresponding to the ejection portion 600 is held in each of the shift registers 212. The print data signal SI is supplied in the order of the final n-th stage, . . . , the second stage, and the first stage corresponding to the ejection portion 600 in the shift register 212.

When the latch signal LAT rises, each of the latch circuits 214 simultaneously latches the print data [SIH, SIL] held in the corresponding shift register 212. LT1, LT2, . . . , LTn illustrated in FIG. 7 represent the print data [SIH, SIL] latched by the latch circuits 214 corresponding to the shift registers 212 of the first stage, the second stage, . . . , the n-th stage.

The decoder 216 outputs the selection signal S having a logic level according to the contents illustrated in FIG. 6 in each of the periods T1, T2, and T3 in accordance with the dot size defined by the latched print data [SIH, SIL].

When the print data [SIH, SIL] is [1, 1], according to the selection signal S, the selection circuit 230 selects the trapezoidal waveform Adp in the period T1, selects the trapezoidal waveform Bdp in the period T2, and does not select the trapezoidal waveform Cdp in the period T3. As a result, the drive signal VOUT corresponding to the large dot illustrated in FIG. 7 is generated. Therefore, a medium amount of ink and a small amount of ink are ejected from the ejection portion 600. Then, the ink is combined on the medium P, so that large dots are formed on the medium P. When the print data [SIH, SIL] is [1, 0], according to the selection signal S, the selection circuit 230 selects the trapezoidal waveform Adp in the period T1, does not select the trapezoidal waveform Bdp in the period T2, and does not select the trapezoidal waveform Cdp in the period T3. As a result, the drive signal VOUT corresponding to the medium dot illustrated in FIG. 7 is generated. Therefore, a medium amount of ink is ejected from the ejection portion 600. Accordingly, medium dots are formed on the medium P. When the print data [SIH, SIL] is [0, 1], according to the selection signal S, the selection circuit 230 does not select the trapezoidal waveform Adp in the period T1, selects the trapezoidal waveform Bdp in the period T2, and does not select the trapezoidal waveform Cdp in the period T3. As a result, the drive signal VOUT corresponding to the small dot illustrated in FIG. 7 is generated. Therefore, a small amount of ink is ejected from the ejection portion 600. Accordingly, small dots are formed on the medium P. When the print data [SIH, SIL] is [0, 0], according to the selection signal S, the selection circuit 230 does not select the trapezoidal waveform Adp in the period T1, does not select the trapezoidal waveform Bdp in the period T2, and selects the trapezoidal waveform Cdp in the period T3. As a result, the drive signal VOUT corresponding to the slight vibration illustrated in FIG. 7 is generated. Therefore, ink is not ejected from the ejection portion 600, and a slight vibration occurs.

Figure 8:
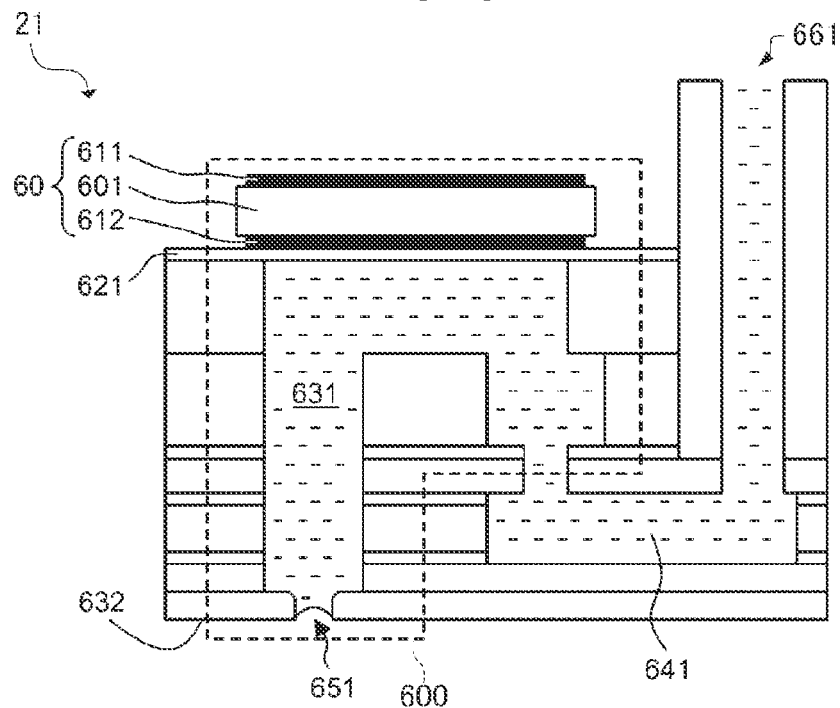
FIG. 8 is a diagram illustrating a schematic configuration of an ejection portion.

Here, the configuration of the ejection portion 600 including the piezoelectric element 60 will be described with reference to FIG. 8. FIG. 8 is a diagram illustrating a schematic configuration of the ejection portion 600 when the print head 21 is cut so as to include the ejection portion 600.

As illustrated in FIG. 8, the print head 21 includes the ejection portion 600 and a reservoir 641. Ink is introduced into the reservoir 641 from a supply port 661. The reservoir 641 is provided for each color of ink.

The ejection portion 600 includes the piezoelectric element 60, a vibration plate 621, a cavity 631, and a nozzle 651. The vibration plate 621 is provided between the cavity 631 and the piezoelectric element 60. Then, the vibration plate 621 is displaced by driving the piezoelectric element 60 provided on the upper surface thereof. That is, the vibration plate 621 functions as a diaphragm that expands/reduces the internal volume of the cavity 631 by being displaced. The inside of the cavity 631 is filled with ink. Further, the cavity 631 functions as a pressure chamber whose internal volume changes when the piezoelectric element 60 is driven. The nozzle 651 is an opening provided in a nozzle plate 632 and communicating with the cavity 631.

The piezoelectric element 60 has a structure in which a piezoelectric body 601 is sandwiched by a pair of electrodes 611 and 612. The drive signal VOUT is supplied to the electrode 611, and the reference voltage signal VBS is supplied to the electrode 612. The piezoelectric element 60 having such a structure operates according to a potential difference between the electrodes 611 and 612. Then, with the operation of the piezoelectric element 60, the central portions of the electrodes 611 and 612 and the vibration plate 621 are vertically displaced with respect to both end portions. Then, the internal volume of the cavity 631 changes with the displacement of the vibration plate 621, so that the ink filled in the cavity 631 is ejected from the nozzle 651. The configuration of the piezoelectric element 60 is not limited to the illustrated configuration, and may be, for example, a longitudinal vibration type.

As described above, the print head 21 ejects ink by supplying the drive signal VOUT to the piezoelectric element 60. That is, the drive signal VOUT is an example of the drive signal. The drive signal VOUT is generated by selecting or deselecting the waveform of the drive signal COM output from the drive circuit 50. Therefore, the drive signal COM output from the drive circuit 50 is also an example of the drive signal.

Figure 9:
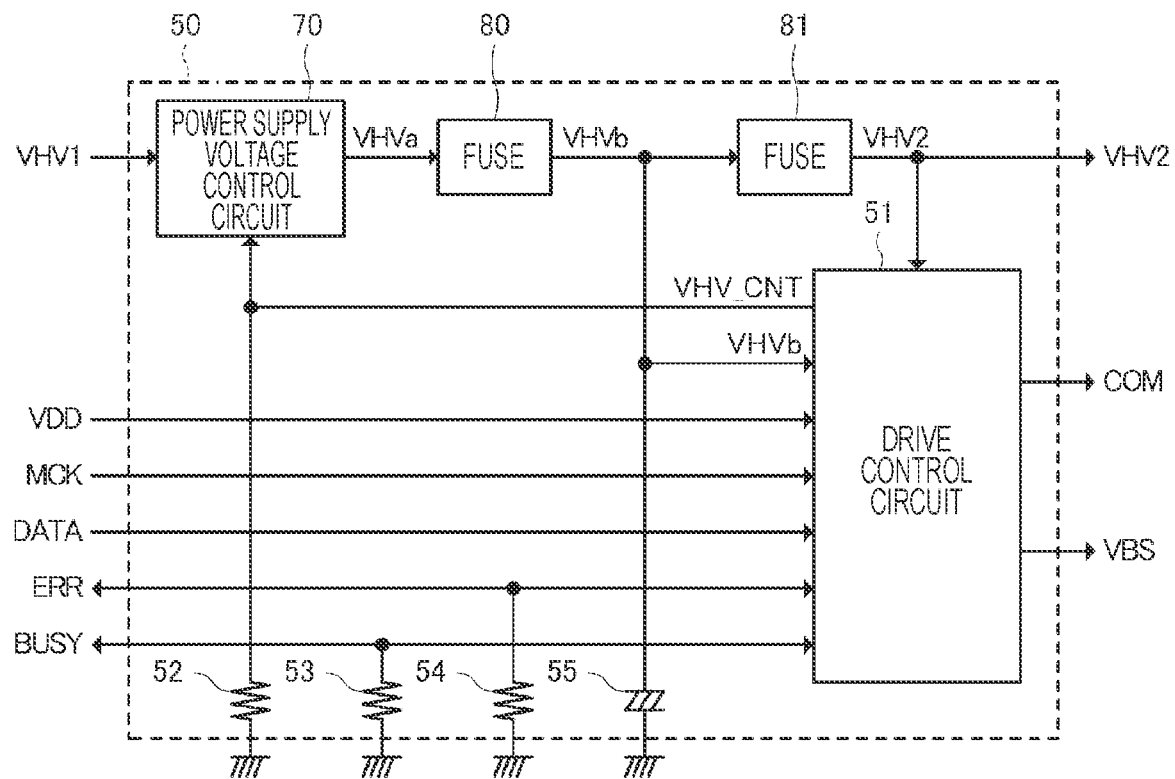
FIG. 9 is a diagram illustrating a functional configuration of a drive circuit.

4. Configuration and Operation of Drive Circuit
4.1 Electrical Configuration of Drive Circuit Next, the configuration and operation of the drive circuit 50 will be described. FIG. 9 is a diagram illustrating a functional configuration of the drive circuit 50. The drive circuit 50 includes a power supply voltage control circuit 70, fuses 80 and 81, a drive control circuit 51, and other circuit elements. Then, the drive circuit 50 outputs the drive signal COM for driving the piezoelectric element 60 in the print head 21. In other words, the drive circuit 50 outputs the drive signal COM that is the basis of the drive signal VOUT for operating the piezoelectric element 60 in the print head 21.

The voltage signal VHV1 output from the first power supply circuit 90a is input to the power supply voltage control circuit 70. The power supply voltage control circuit 70 switches whether or not to output the input voltage signal VHV1 as a voltage signal VHVa. The voltage signal VHVa output from the power supply voltage control circuit 70 is input to the fuse 80. The fuse 80 outputs the input voltage signal VHVa to the fuse 81 as a voltage signal VHVb. The fuse 81 outputs the input voltage signal VHVb as the voltage signal VHV2. The voltage signal VHV2 is output from the drive circuit 50. Then, the voltage signal VHV2 output from the drive circuit 50 is input to the drive signal selection control circuit 200 in the print head 21.

The voltage signal VHVb output from the fuse 80 is also input to the drive control circuit 51. Similarly, the voltage signal VHV2 output from the fuse 81 is also input to the drive control circuit 51. That is, the drive control circuit 51 receives the voltage signal VHVb to which the voltage signal VHVa output from the power supply voltage control circuit 70 is output via the fuse 80, and the voltage signal VHV2 to which the voltage signal VHVa output from the power supply voltage control circuit 70 is output via the fuses 80 and 81.

The drive control circuit 51 receives, in addition to the above-mentioned voltage signals VHV2 and VHVb, the voltage signal VDD output from the second power supply circuit 90b, the clock signal MCK output from the oscillator circuit 91, and the drive data signal DATA output from the control signal output circuit 100. Further, the drive control circuit 51 receives an error signal ERR and a status signal BUSY output from the control signal output circuit 100, and outputs the error signal ERR and the status signal BUSY to the control signal output circuit 100. That is, the error signal ERR and the status signal BUSY are propagated bidirectionally between the drive control circuit 51 and the control signal output circuit 100.

4.2 Configuration and Operation of Power Supply Voltage Control Circuit

Figure 10:
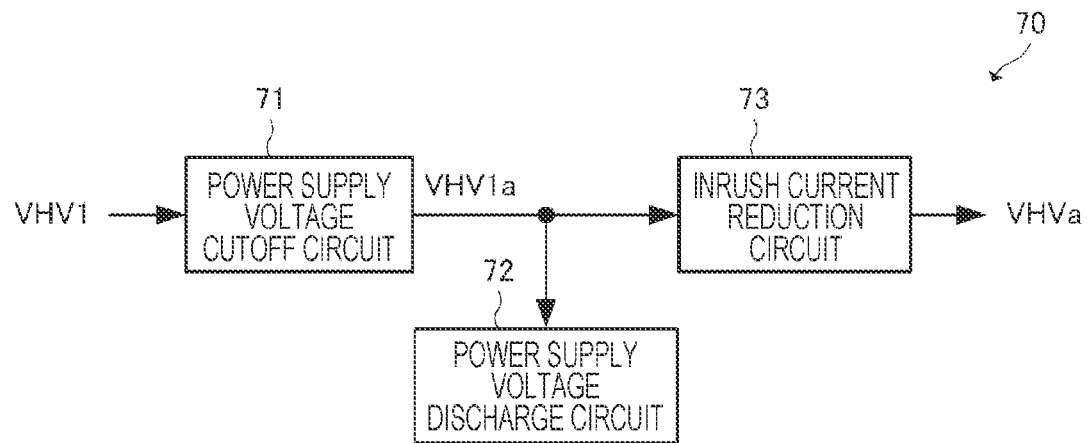
FIG. 10 is a diagram illustrating a functional configuration of a power supply voltage control circuit.

The configuration and operation of the power supply voltage control circuit 70 will be described. FIG. 10 is a diagram illustrating a functional configuration of the power supply voltage control circuit 70. As illustrated in FIG. 10, the power supply voltage control circuit 70 has a power supply voltage cutoff circuit 71, a power supply voltage discharge circuit 72, and an inrush current reduction circuit 73. The voltage signal VHV1 input to the power supply voltage control circuit 70 is input to the power supply voltage cutoff circuit 71. The power supply voltage cutoff circuit 71 controls whether or not to supply the input voltage signal VHV1 to the inrush current reduction circuit 73 as a voltage signal VHV1a. The inrush current reduction circuit 73 reduces an inrush current generated when the supply of the voltage signal VHV1a is started from the state in which the supply of the voltage signal VHV1a is cut off in the power supply voltage cutoff circuit 71. The power supply voltage discharge circuit 72 is electrically coupled to the wiring through which the power supply voltage cutoff circuit 71 and the inrush current reduction circuit 73 are electrically coupled and the voltage signal VHV1a is propagated. The power supply voltage discharge circuit 72 controls discharge of the charge stored in a path through which the voltage signal VHV1a output from the power supply voltage cutoff circuit 71 is supplied.

Figure 11:
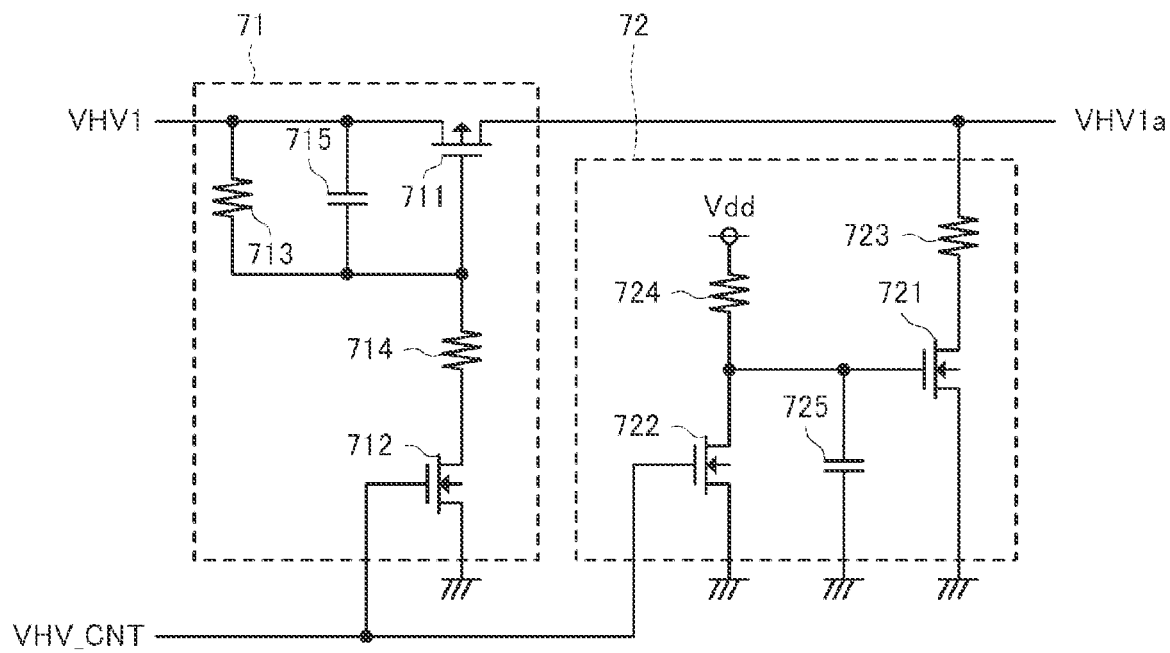
FIG. 11 is a diagram illustrating an example of configurations of a power supply voltage cutoff circuit and a power supply voltage discharge circuit.

Specific examples of the configurations of the power supply voltage cutoff circuit 71, the power supply voltage discharge circuit 72, and the inrush current reduction circuit 73 in the power supply voltage control circuit 70 will be described with reference to FIGS. 11 and 12. FIG. 11 is a diagram illustrating an example of configurations of the power supply voltage cutoff circuit 71 and the power supply voltage discharge circuit 72. As illustrated in FIG. 11, the power supply voltage cutoff circuit 71 includes transistors 711 and 712, resistors 713 and 714, and a capacitor 715. Here, the description will be made assuming that the transistor 711 is a PMOS transistor and the transistor 712 is an NMOS transistor.

The voltage signal VHV1 is input to a source terminal of the transistor 711. Then, the source terminal and a drain terminal of the transistor 711 are controlled to be conductive, so that the voltage signal VHV1 is output from the drain terminal of the transistor 711 as the voltage signal VHV1*a*. That is, the power supply voltage control circuit 70 switches between the source terminal and the drain terminal of the transistor 711 to be conductive or non-conductive to switch whether or not to output the voltage signal VHV1 as the voltage signal VHV1*a*. A gate terminal of the transistor 711 is electrically coupled to one end of the resistor 713, one end of the resistor 714, and one end of the capacitor 715.

The voltage signal VHV1 is input to the other end of The resistor 713 and the other end of the capacitor 715. The other end of the resistor 714 is electrically coupled to a drain terminal of the transistor 712. The ground potential is supplied to a source terminal of the transistor 712. Further, a VHV control signal VHV_CNT output from the drive control circuit 51, which will be described later, is input to a gate terminal of the transistor 712.

When the VHV control signal VHV_CNT of H level is input to the power supply voltage cutoff circuit 71 configured as described above, the transistor 712 is controlled to be conductive. Then, the transistor 712 is controlled to be conductive, so that the source terminal and the drain terminal of the transistor 711 become conductive. Therefore, the voltage signal VHV1 is output as the voltage signal VHV1*a*. On the other hand, when the VHV control signal VHV_CNT of L level is input to the power supply voltage cutoff circuit 71, the transistor 712 is controlled to be non-conductive. Then, the transistor 712 is controlled to be non-conductive, so that the source terminal and the drain terminal of the transistor 711 become non-conductive. Therefore, the voltage signal VHV1 is not output as the voltage signal VHV1*a*. As described above, the power supply voltage cutoff circuit 71 including the transistor 711 switches whether or not to output the voltage signal VHV1 as the voltage signal VHV1*a* based on a logic level of the VHV control signal VHV_CNT.

The power supply voltage discharge circuit 72 includes transistors 721 and 722, resistors 723 and 724, and a capacitor 725. Here, the description will be made assuming that the transistors 721 and 722 are both NMOS transistors.

One end of the resistor 723 is electrically coupled to the wiring through which the voltage signal VHV1*a* is propagated, and the other end of the resistor 723 is electrically coupled to a drain terminal of the transistor 721. The ground potential is supplied to a source terminal of the transistor 721. A gate terminal of the transistor 721 is electrically coupled to one end of the resistor 724, one end of the capacitor 725, and a drain terminal of the transistor 722. The voltage signal VDD is supplied to the other end of the resistor 724. The ground potential is supplied to the other end of the capacitor 725 and a source terminal of the transistor 722. Then, the VHV control signal VHV_CNT is input to a gate terminal of the transistor 722.

The power supply voltage discharge circuit 72 configured as described above is electrically coupled to the wiring through which the power supply voltage cutoff circuit 71 and the inrush current reduction circuit 73 are electrically coupled. Then, the power supply voltage discharge circuit 72 controls the discharge of the stored charge based on the voltage signal VHV1*a* according to the logic level of the VHV control signal VHV_CNT. Specifically, when the VHV control signal VHV_CNT of H level is input to the power supply voltage discharge circuit 72, the transistor 722 is controlled to be conductive. Then, the transistor 722 is controlled to be conductive, so that the transistor 721 is controlled to be non-conductive. Therefore, the path through which the voltage signal VHV1*a* is propagated and the path through which the ground potential is supplied are controlled to be non-conductive by the transistor 721. As a result, the power supply voltage discharge circuit 72 does not perform discharge of the charge based on the voltage signal VHV1*a*.

On the other hand, when the VHV control signal VHV_CNT of L level is input to the power supply voltage discharge circuit 72, the transistor 722 is controlled to be non-conductive. Then, the transistor 722 is controlled to be non-conductive, so that the voltage signal VDD is supplied to the gate terminal of the transistor 721. Therefore, the transistor 721 is controlled to be conductive. Thereby, the path through which the voltage signal VHV1*a* is propagated and the path through which the ground potential is supplied are electrically coupled to each other via the resistor 723. As a result, the power supply voltage discharge circuit 72 discharges the charge stored in the path through which the voltage signal VHV1*a* is propagated.

As described above, the power supply voltage cutoff circuit 71 and the power supply voltage discharge circuit 72 switch whether to output the voltage signal VHV1 to the inrush current reduction circuit 73 as the voltage signal VHV1*a* based on the logic level of the VHV control signal VHV_CNT, or discharge the charge stored in the path through which the voltage signal VHV1*a* is propagated.

Figure 12:
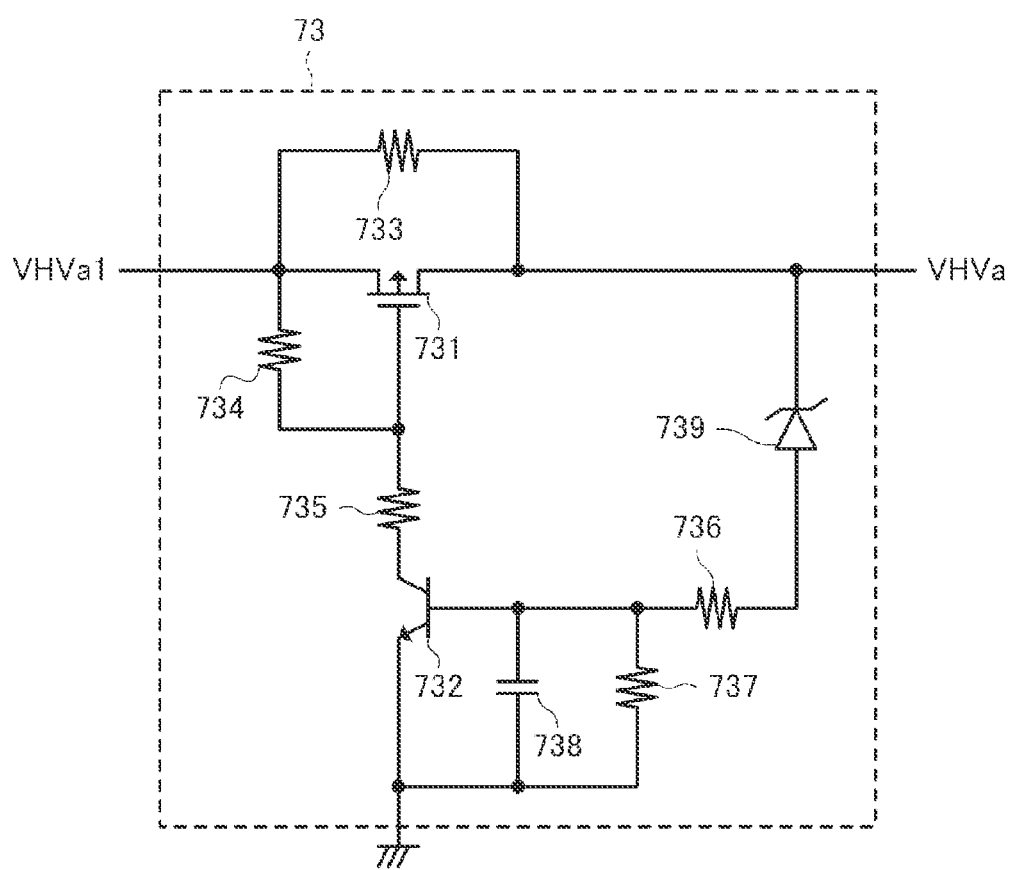
FIG. 12 is a diagram illustrating an example of an electrical configuration of an inrush current reduction circuit.

FIG. 12 is a diagram illustrating an example of an electrical configuration of the inrush current reduction circuit 73. As illustrated in FIG. 12, the inrush current reduction circuit 73 includes transistors 731 and 732, resistors 733, 734, 735, 736, and 737, a capacitor 738, and a constant voltage diode 739. Here, the description will be made assuming that the transistor 731 is a PMOS transistor and the transistor 732 is an N-type bipolar transistor.

The voltage signal VHV1*a* is input to a source terminal of the transistor 731. Then, a drain terminal and the source terminal of the transistor 731 are controlled to be conductive, so that the voltage signal VHV1*a* is output from the drain terminal of the transistor 731 as the voltage signal VHVa. A gate terminal of the transistor 731 is electrically coupled to one end of the resistor 734 and one end of the resistor 735. The voltage signal VHV1*a* is input to the other end of the resistor 734. The resistor 733 has one end electrically coupled to the source terminal of the transistor 731 and the other end electrically coupled to the drain terminal of the transistor 731.

The other end of the resistor 735 is electrically coupled to a collector terminal of the transistor 732. The ground potential is supplied to an emitter terminal of the transistor 732. A base terminal of the transistor 732 is electrically coupled to one end of the resistor 736, one end of the resistor 737, and one end of the capacitor 738. The ground potential is supplied to the other end of the resistor 737 and the other end of the capacitor 738. The other end of the resistor 736 is electrically coupled to an anode terminal of the constant voltage diode 739. The voltage signal VHVa is input to a cathode terminal of the constant voltage diode 739.

In the inrush current reduction circuit 73 configured as described above, when the supply of the voltage signal VHV1a is cut off in the power supply voltage cutoff circuit 71, the voltage signal VHV1a is not input thereto. Therefore, the inrush current reduction circuit 73 does not output the voltage signal VHVa. Then, since the voltage signal VHVa is not output, the potential of the anode terminal of the constant voltage diode 739 becomes the ground potential supplied via the resistor 737. In this case, the transistor 732 is controlled to be non-conductive and the transistor 731 also is controlled to be non-conductive.

Then, when the supply of the voltage signal VHV1a is started from the state in which the supply of the voltage signal VHV1a is cut off in the power supply voltage cutoff circuit 71, the voltage signal VHV1a is input to the inrush current reduction circuit 73. In this case, since the transistor 731 is controlled to be non-conductive, the voltage signal VHV1a is input to the drain terminal of the transistor 731 as the voltage signal VHVa via the resistor 733. At this time, the current generated due to the voltage signal VHV1a and the voltage signal VHVa is limited by the resistor 733. Therefore, the possibility that a large inrush current may occur is reduced.

Then, after the input of the voltage signal VHV1a to the inrush current reduction circuit 73 is started, a predetermined period of time elapses, so that the voltage value of the voltage signal VHVa increases. Specifically, the voltage signal VHV1a input to the inrush current reduction circuit 73 is input to a capacitor 55 illustrated in FIG. 9 via the resistor 733 and the fuse 80. Thereby, the charge is stored in the capacitor 55. Then, as the charge is stored in the capacitor 55, the voltage value of the voltage signal VHVa increases. When the voltage value of the voltage signal VHVa becomes equal to or higher than a predetermined value defined by the constant voltage diode 739, the voltage value on the anode terminal side of the constant voltage diode 739 increases. Then, the voltage value on the anode terminal side of the constant voltage diode 739 exceeds a threshold voltage of the transistor 732, so that the transistor 732 is controlled to be conductive. When the transistor 732 is controlled to be conductive, the transistor 731 is controlled to be conductive. As a result, the drain terminal and the source terminal of the transistor 731 are controlled to be conductive, and the voltage signal VHV1a is output from the power supply voltage control circuit 70 as the voltage signal VHVa via the transistor 731.

As described above, the inrush current reduction circuit 73 propagates the voltage signal VHV1a to the drain terminal of the transistor 731 via the resistor 733 immediately after the supply of the voltage signal VHV1a is started from the state where the supply of the voltage signal VHV1a is cut off. Thereby, the possibility that a large inrush current may occur is reduced. Further, the voltage value of the voltage signal VHVa becomes equal to or higher than the predetermined value defined by the constant voltage diode 739, so that the transistor 731 is controlled to be conductive. Thereby, the power loss due to the resistor 733 is reduced.

4.3 Configuration and Operation of Drive Control Circuit

Next, the configuration and operation of the drive control circuit 51 will be described. As illustrated in FIG. 9, the voltage signal VHVa output from the power supply voltage control circuit 70 is input to the drive control circuit 51 as the voltage signal VHVb via the fuse 80, and input to the drive control circuit 51 as the voltage signal VHV2 via the fuses 80 and 81.

Figure 13:
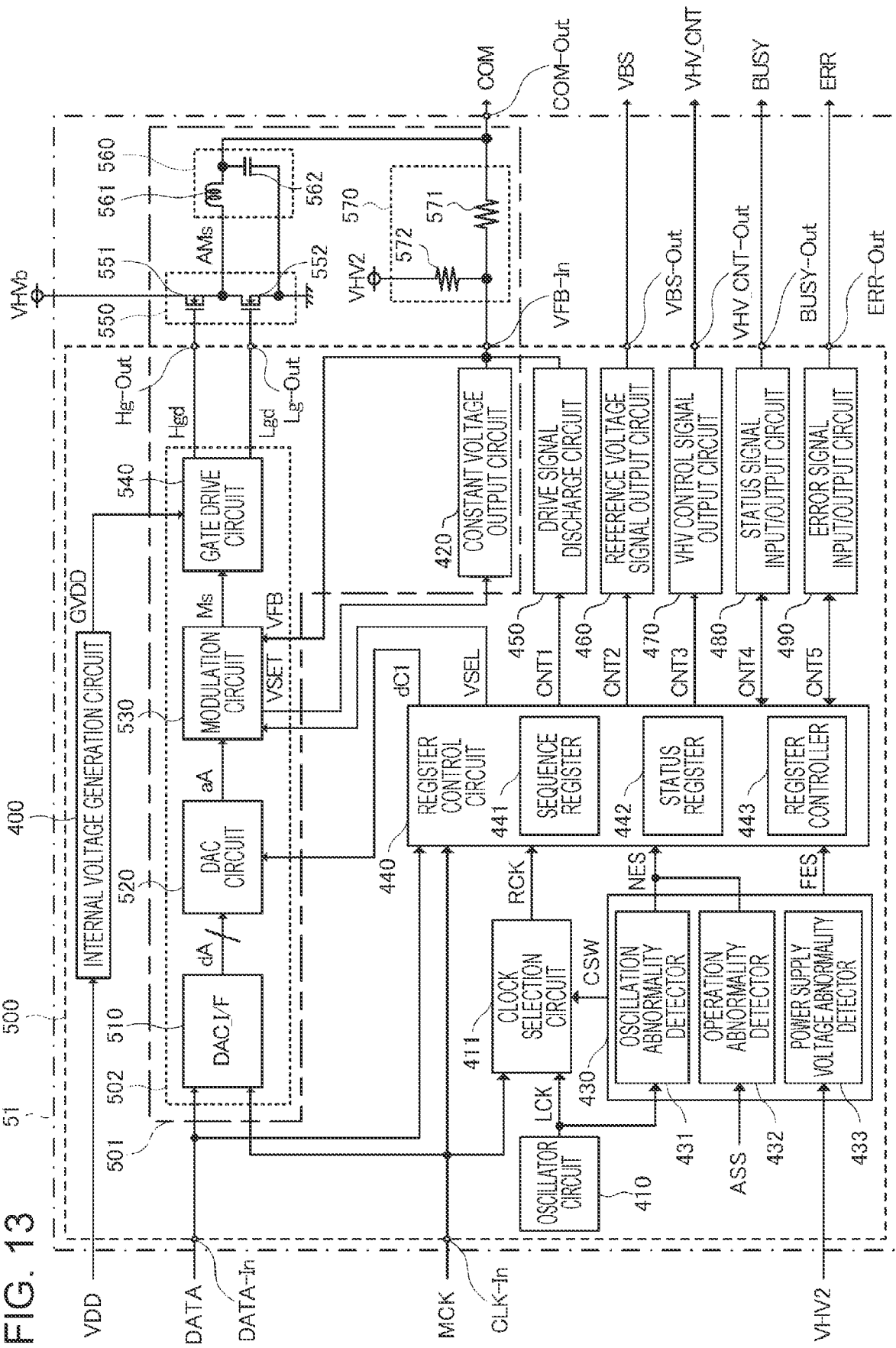
FIG. 13 is a diagram illustrating a configuration of a drive control circuit.

FIG. 13 is a diagram illustrating a configuration of the drive control circuit 51. As illustrated in FIG. 13, the drive control circuit 51 included in the drive circuit 50 includes an integrated circuit 500, an amplifier circuit 550, a demodulation circuit 560, and a feedback circuit 570. That is, the drive circuit 50 has the integrated circuit 500 that outputs amplification control signals Hgd and Lgd based on a base drive signal dA, the amplifier circuit 550 that operates according to the amplification control signals Hgd and Lgd to output an amplified modulation signal AMs, the demodulation circuit 560 that demodulates the amplified modulation signal AMs to output the drive signal COM, and the feedback circuit 570 that feeds back a feedback signal VFB based on the drive signal COM to a modulation circuit 530 in the integrated circuit 500.

The integrated circuit 500 includes an amplification control signal generation circuit 502, an internal voltage generation circuit 400, an oscillator circuit 410, a clock selection circuit 411, an abnormality detection circuit 430, a register control circuit 440, a constant voltage output circuit 420, a drive signal discharge circuit 450, a reference voltage signal output circuit 460, a VHV control signal output circuit 470, a status signal input/output circuit 480, and error signal input/output circuit 490. That is, the integrated circuit 500 includes the modulation circuit 530 that modulates a base drive signal aA to output a modulation signal Ms, the gate drive circuit 540 that outputs the amplification control signals Hgd and Lgd according to the modulation signal Ms, the drive signal discharge circuit 450 that discharges a charge based on the drive signal COM, and the constant voltage output circuit 420 that outputs a DC voltage signal.

The voltage signal VDD is supplied to the internal voltage generation circuit 400. The internal voltage generation circuit 400 generates a voltage signal GVDD having a voltage value of DC 7.5 V, for example, by stepping up or stepping down the input voltage signal VDD. The voltage signal GVDD is input to various configurations of the integrated circuit 500 including the gate drive circuit 540, which will be described later.

The amplification control signal generation circuit 502 generates the amplification control signals Hgd and Lgd based on a data signal that defines the waveform of the drive signal COM included in the drive data signal DATA input from a terminal DATA-In. The amplification control signal generation circuit 502 includes a digital to analog converter (DAC) interface (DAC_I/F) 510, a DAC circuit 520, the modulation circuit 530, and a gate drive circuit 540.

The drive data signal DATA supplied from the terminal DATA-In and the clock signal MCK supplied from a terminal MCK-In are input to the DAC interface 510. The DAC interface 510 integrates the drive data signal DATA based on the clock signal MCK, and generates a 10-bit base drive signal dA that defines the waveform of the drive signal COM, for example. The base drive signal dA is input to the DAC circuit 520. The DAC circuit 520 converts the input base drive signal dA into an analog base drive signal aA. The base drive signal aA is a target signal before amplification of the drive signal COM.

The base drive signal aA is input to the modulation circuit 530. The modulation circuit 530 outputs the modulation signal Ms obtained by performing pulse width modulation on the base drive signal aA. In other words, the modulation circuit 530 modulates the base drive signal aA to output the modulation signal Ms.

The voltage signals VHVb and GVDD, and the modulation signal Ms are input to the gate drive circuit 540. The gate drive circuit 540 generates the amplification control signal Hgd that amplifies the input modulation signal Ms based on the voltage signal GVDD and is level-shifted to a high-amplitude logic based on the voltage signal VHVb, and the amplification control signal Lgd that inverts a logic level of the input modulation signal Ms and is amplified based on the voltage signal GVDD. Therefore, the amplification control signal Hgd and the amplification control signal Lgd exclusively become H level. Here, the gate drive circuit 540 which has an amplifier circuit including a switching element and outputs the amplification control signals Hgd and Lgd according to the modulation signal Ms is an example of a switching circuit.

Here, the amplification control signal Hgd and the amplification control signal Lgd exclusively becoming H level includes that the amplification control signal Hgd and the amplification control signal Lgd do not become H level at the same time. That is, the gate drive circuit 540 may include a timing control circuit that controls the timing when the amplification control signal Hgd and the amplification control signal Lgd become H level so that the amplification control signal Hgd and the amplification control signal Lgd do not become H level at the same time.

The amplifier circuit 550 operates based on the amplification control signals Hgd and Lgd to output the amplified modulation signal AMs. In other words, the amplifier circuit 550 amplifies the modulation signal Ms to output the amplified modulation signal AMs. The amplifier circuit 550 includes transistors 551 and 552. Each of the transistors 551 and 552 is, for example, an N channel type field effect transistor (FET).

The voltage signal VHVb is supplied to a drain terminal of the transistor 551. The amplification control signal Hgd is supplied to a gate terminal of the transistor 551 via a terminal Hg-Out. A source terminal of the transistor 551 is electrically coupled to a drain terminal of the transistor 552. The amplification control signal Lgd is supplied to a gate terminal of the transistor 552 via a terminal Lg-Out. The ground potential is supplied to a source terminal of the transistor 552. The transistor 551 coupled as described above operates according to the amplification control signal Hgd, and the transistor 552 operates according to the amplification control signal Lgd that becomes H level exclusively with respect to the amplification control signal Hgd. That is, the transistor 551 and the transistor 552 become exclusively conductive. Thereby, the amplified modulation signal AMs obtained by amplifying the modulation signal Ms based on the voltage signal VHVb is generated at the coupling point between the source terminal of the transistor 551 and the drain terminal of the transistor 552.

The amplified modulation signal AMs generated by the amplifier circuit 550 is input to the demodulation circuit 560. The demodulation circuit 560 includes a coil 561 and a capacitor 562. One end of the coil 561 is electrically coupled to the source terminal of the transistor 551 and the drain terminal of the transistor 552. The other end of the coil 561 is electrically coupled to one end of the capacitor 562. The ground potential is supplied to the other end of the capacitor 562. That is, the coil 561 and the capacitor 562 form a low pass filter. Then, the amplified modulation signal AMs is supplied to the demodulation circuit 560, so that the amplified modulation signal AMs is demodulated and the drive signal COM is generated. That is, the demodulation circuit 560 demodulates the amplified modulation signal AMs and outputs the drive signal COM from a terminal COM-Out.

Further, the drive signal COM generated by the demodulation circuit 560 is fed back to the modulation circuit 530 included in the integrated circuit 500 as the feedback signal VFB via the feedback circuit 570. In other words, the feedback circuit 570 feeds back the feedback signal VFB based on the drive signal COM to the integrated circuit 500. The feedback circuit 570 includes resistors 571 and 572. One end of the resistor 571 is electrically coupled to the other end of the coil 561 and the other end of the resistor 571 is electrically coupled to one end of the resistor 572. The voltage signal VHV2 is supplied to the other end of the resistor 572. Then, the other end of the resistor 571 and one end of the resistor 572 are electrically coupled to the modulation circuit 530 via a terminal VFB-In. That is, the drive signal COM is pulled up by the voltage signal VHV2 and fed back to the modulation circuit 530 via the feedback circuit 570.

As described above, the amplification control signal generation circuit 502, the amplifier circuit 550, the demodulation circuit 560, and the feedback circuit 570 included in the integrated circuit 500 generate the drive signal COM for driving the piezoelectric element 60 based on the drive data signal DATA. Then, the generated drive signal COM is supplied to the electrode 611 of the piezoelectric element 60 via the terminal COM-Out and the selection circuit 230. That is, the terminal COM-Out is electrically coupled to the terminal TG-In of the selection circuit 230. The amplification control signal generation circuit 502, the amplifier circuit 550, the demodulation circuit 560, and the feedback circuit 570 configured as described above output, as the drive signal COM, a signal including the trapezoidal waveforms Adp, Bdp, and Cdp illustrated in FIG. 3 for driving the piezoelectric element 60 based on the drive data signal DATA. Moreover, it is also possible to output a signal having a constant voltage value as the drive signal COM.

The oscillator circuit 410 generates and outputs a clock signal LCK that defines the operation timing of the integrated circuit 500. The clock signal LCK is input to the clock selection circuit 411 and the abnormality detection circuit 430.

The clock signals MCK and LCK and a clock selection signal CSW are input to the clock selection circuit 411. The clock selection circuit 411 switches whether to output the clock signal MCK as a clock signal RCK to the register control circuit 440 or output the clock signal LCK as the clock signal RCK to the register control circuit 440 based on a logic level of the clock selection signal CSW. In the present embodiment, the description will be made assuming that the clock selection circuit 411 outputs the clock signal MCK as the clock signal RCK to the register control circuit 440 when the clock selection signal CSW is at H level, and outputs the clock signal lCK as the clock signal RCK to the register control circuit 440 when the clock selection signal CSW is at L level.

The abnormality detection circuit 430 includes an oscillation abnormality detector 431, an operation abnormality detector 432, and a power supply voltage abnormality detector 433.

The clock signal LCK output from the oscillator circuit 410 is input to the oscillation abnormality detector 431. The oscillation abnormality detector 431 detects whether or not the input clock signal LCK is normal, and outputs the clock selection signal CSW having a logic level based on the detection result and an error signal NES. For example, the oscillation abnormality detector 431 detects at least one of the frequency and the voltage value of the clock signal LCK. Then, when the oscillation abnormality detector 431 detects that at least one of the frequency and the voltage value of the clock signal LCK is abnormal, the oscillation abnormality detector 431 outputs the clock selection signal CSW and the error signal NES indicating abnormality to the clock selection circuit 411 and the register control circuit 440, respectively. Further, when both the frequency and the voltage value of the clock signal LCK are normal, the oscillation abnormality detector 431 outputs the clock selection signal CSW and the error signal NES indicating normality to the clock selection circuit 411 and the register control circuit 440, respectively.

An operation status signal ASS indicating the operation status of the various configurations of the drive control circuit 51 is input to the operation abnormality detector 432. The operation abnormality detector 432 detects whether or not the various configurations of the drive control circuit 51 are operating normally based on the input operation status signal ASS. In the present embodiment, when any of the various configurations of the drive control circuit 51 is abnormal, the operation status signal ASS indicating the abnormality is input to the operation abnormality detector 432. Then, when the operation status signal ASS indicating the abnormality is input to the operation abnormality detector 432, the operation abnormality detector 432 outputs the error signal NES indicating the abnormality to the register control circuit 440.

The voltage signal VHV2 that is output from the drive circuit 50 and is supplied to the print head 21 is input to the power supply voltage abnormality detector 433. Then, the power supply voltage abnormality detector 433 detects the voltage value of the voltage signal VHV2. The power supply voltage abnormality detector 433 detects whether or not the voltage value of the voltage signal VHV2 supplied to the print head 21 is normal based on the voltage value of the voltage signal VHV2. When the power supply voltage abnormality detector 433 determines that the voltage value of the voltage signal VHV2 supplied to the print head 21 is abnormal, an error signal FES indicating the abnormality is output to the register control circuit 440.

The register control circuit 440 includes a sequence register 441, a status register 442, and a register controller 443. The sequence register 441 and the status register 442 hold operation information and the like input as the drive data signal DATA in synchronization with the clock signal MCK. Then, the register controller 443 generates control signals CNT1 to CNT5 based on the information held in the sequence register 441 and the status register 442 in synchronization with the clock signal RCK, and outputs the control signals to the corresponding configurations.

The control signal CNT1 is input to the drive signal discharge circuit 450. The drive signal discharge circuit 450 controls whether or not to discharge the stored charge based on the drive signal COM output from the demodulation circuit 560 via the feedback circuit 570. The drive signal discharge circuit 450 is electrically coupled to the propagation path through which the drive signal COM output from the demodulation circuit 560 is propagated via the terminal VFB-In and the feedback circuit 570. That is, the drive signal discharge circuit 450 discharges the charge based on the drive signal COM.

Figure 14:
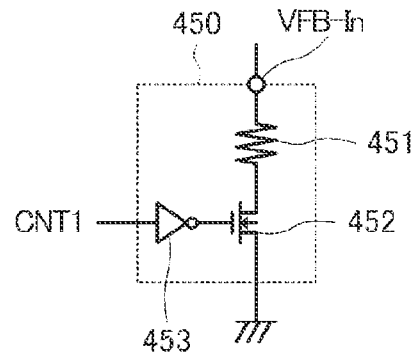
FIG. 14 is a diagram illustrating an example of an electrical configuration of a drive signal discharge circuit.

FIG. 14 is a diagram illustrating an example of an electrical configuration of the drive signal discharge circuit 450. The drive signal discharge circuit 450 includes a resistor 451, a transistor 452, and an inverter 453. Note that the description will be made assuming that the transistor 452 is an NMOS transistor.

One end of the resistor 451 is electrically coupled to the terminal VFB-In. The other end of the resistor 451 is electrically coupled to a drain terminal of the transistor 452. The ground potential is supplied to a source terminal of the transistor 452. The control signal CNT1 is input to a gate terminal of the transistor 452 via the inverter 453. When the control signal CNT1 of H level is input to the drive signal discharge circuit 450 configured as described above, the transistor 452 is controlled to be non-conductive. Therefore, the drive signal discharge circuit 450 does not perform discharge of the charge stored in the propagation path through which the drive signal COM is propagated. On the other hand, when the control signal CNT1 of L level is input to the drive signal discharge circuit 450, the transistor 452 is controlled to be conductive. Therefore, in the drive signal discharge circuit 450, the charge stored in the propagation path through which the drive signal COM is propagated via the feedback circuit 570 is discharged via the resistor 451 and the transistor 452. As described above, the drive signal discharge circuit 450 controls, based on the control signal CNT1, whether or not the drive signal COM discharges the charge based on the drive signal COM stored in the propagation path supplied to the print head 21.

Referring back to FIG. 13, the control signal CNT2 is input to the reference voltage signal output circuit 460. The reference voltage signal output circuit 460 outputs the reference voltage signal VBS supplied to the electrode 612 of the piezoelectric element 60. That is, the reference voltage signal output circuit 460 is electrically coupled to the electrode 612 of the piezoelectric element 60 and outputs the reference voltage signal VBS whose voltage value supplied to the electrode 612 of the piezoelectric element 60 is constant at a voltage Vbs.

Figure 15:
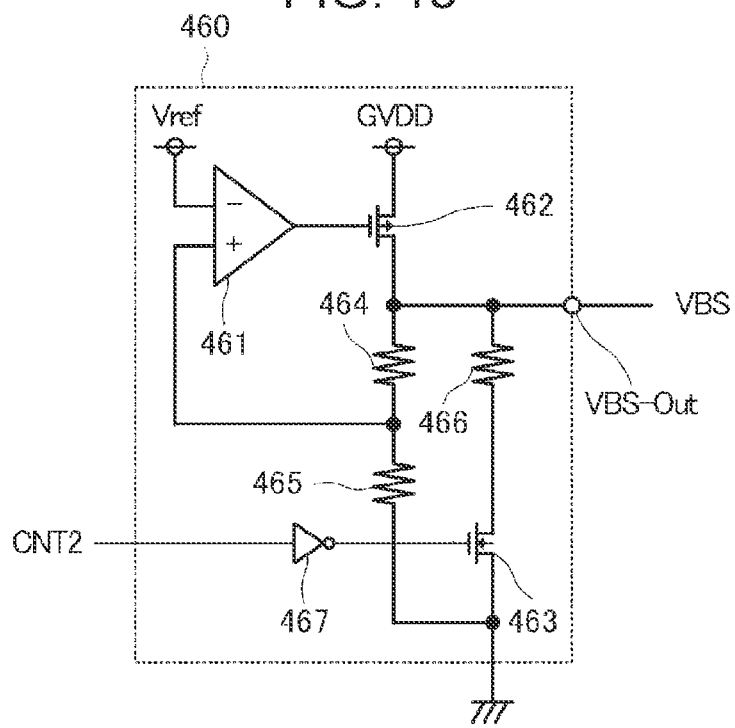
FIG. 15 is a diagram illustrating an example of an electrical configuration of a reference voltage signal output circuit.

FIG. 15 is a diagram illustrating an example of an electrical configuration of the reference voltage signal output circuit 460. The reference voltage signal output circuit 460 includes a comparator 461, transistors 462 and 463, resistors 464, 465 and 466, and an inverter 467. Note that the description will be made assuming that the transistor 462 is a PMOS transistor and the transistor 463 is an NMOS transistor.

A reference voltage Vref is supplied to a − side input end of the comparator 461. A + side input end of the comparator 461 is electrically coupled to one end of the resistor 464 and one end of the resistor 465. An output end of the comparator 461 is electrically coupled to a gate terminal of the transistor 462. The voltage signal GVDD is supplied to a source terminal of the transistor 462. A drain terminal of the transistor 462 is electrically coupled to the other end of the resistor 464, one end of the resistor 466, and a terminal VBS-Out from which the reference voltage signal VBS is output. The other end of the resistor 466 is electrically coupled to a drain terminal of the transistor 463. The control signal CNT2 is input to a gate terminal of the transistor 463 via the inverter 467. The ground potential is supplied to a source terminal of the transistor 463 and the other end of resistor 465.

In the reference voltage signal output circuit 460 configured as described above, when the voltage value supplied to the + side input end of the comparator 461 is larger than the voltage value of the reference voltage Vref supplied to the − side input end of the comparator 461, the comparator 461 outputs an H level signal. At this time, the transistor 462 is controlled to be non-conductive. Therefore, the voltage signal GVDD is not supplied to the terminal VBS-Out. On the other hand, when the voltage value supplied to the + side input end of the comparator 461 is smaller than the voltage value of the reference voltage Vref supplied to the − side input end of the comparator 461, the comparator 461 outputs an L level signal. At this time, the transistor 462 is controlled to be conductive. Therefore, the voltage signal GVDD is supplied to the terminal VBS-Out. That is, the comparator 461 operates so that the voltage value obtained by dividing the reference voltage signal VBS by the resistors 464 and 465 and the voltage value of the reference voltage Vref are equal to each other, and thereby, the reference voltage signal output circuit 460 generates the reference voltage signal VBS having a constant voltage value at the voltage Vbs based on the voltage signal GVDD.

Further, the control signal CNT2 is input to the reference voltage signal output circuit 460. When the control signal CNT2 of H level is input to the reference voltage signal output circuit 460, the transistor 463 is controlled to be non-conductive. Therefore, the terminal VBS-Out and the propagation path through which the ground potential is propagated are controlled to have high impedance. As a result, the reference voltage signal VBS having a constant voltage value at the voltage Vbs is output from the terminal VBS-Out. In other words, when the control signal CNT2 of H level is input to the reference voltage signal output circuit 460, the reference voltage signal output circuit 460 starts outputting the reference voltage signal VBS. On the other hand, when the control signal CNT2 of L level is input to the reference voltage signal output circuit 460, the transistor 463 is controlled to be conductive. Therefore, the ground potential is supplied to the terminal VBS-Out via the resistor 466 and the transistor 463. As a result, the reference voltage signal output circuit 460 outputs the constant reference voltage signal VBS at the ground potential. In other words, when the control signal CNT2 of L level is input to the reference voltage signal output circuit 460, the reference voltage signal output circuit 460 stops the output of the reference voltage signal VBS and sets the voltage value of the terminal VBS-Out to the ground potential.

Referring back to FIG. 13, the control signal CNT3 is input to the VHV control signal output circuit 470. The VHV control signal output circuit 470 outputs the VHV control signal VHV_CNT supplied to the power supply voltage control circuit 70.

Figure 16:
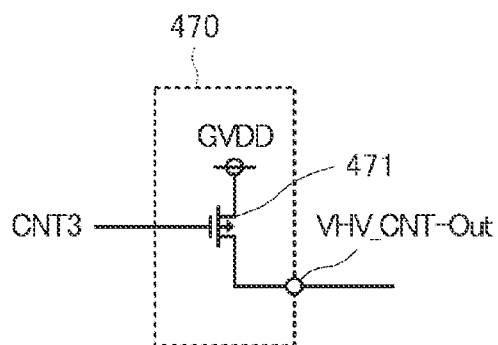
FIG. 16 is a diagram illustrating an example of an electrical configuration of a VHV control signal output circuit.

FIG. 16 is a diagram illustrating an example of an electrical configuration of the VHV control signal output circuit 470. The VHV control signal output circuit 470 includes a transistor 471. Note that the description will be made assuming that the transistor 471 is a PMOS transistor.

The voltage signal GVDD is supplied to a source terminal of the transistor 471. A drain terminal of the transistor 471 is electrically coupled to a terminal VHV_CNT-Out. The control signal CNT3 is input to a gate terminal of the transistor 471. When the control signal CNT3 of L level is input to the VHV control signal output circuit 470 configured as described above, the voltage signal GVDD is supplied to the terminal VHV_CNT-Out, and when the control signal CNT3 of H level is input thereto, the ground potential is supplied to the terminal VHV_CNT-Out. That is, the VHV control signal output circuit 470 inverts the logic level of the control signal CNT3 and outputs the signal amplified to the voltage value of the voltage signal GVDD as the VHV control signal VHV_CNT.

The VHV control signal VHV_CNT output from the VHV control signal output circuit 470 is input to the power supply voltage control circuit 70 illustrated in FIG. 11. Then, the power supply voltage control circuit 70 switches whether or not to supply the voltage signal VHV2 to the print head 21 based on the input VHV control signal VHV_CNT. Specifically, when the control signal CNT3 of H level is input to the VHV control signal output circuit 470, the VHV control signal output circuit 470 outputs the VHV control signal VHV_CNT of H level to the power supply voltage control circuit 70. As a result, the power supply voltage control circuit 70 supplies the voltage signal VHV1 to the print head 21 as the voltage signal VHV2.

Referring back to FIG. 13, the control signal CNT4 is input to the status signal input/output circuit 480. The status signal input/output circuit 480 outputs the status signal BUSY indicating the operation status of the drive control circuit 51, and inputs the status signal BUSY output from another configuration. Here, the other configuration may be, for example, a different drive control circuit 51 when the liquid ejecting apparatus 1 has a plurality of drive control circuits 51, and may be, for example, the control signal output circuit 100.

Figure 17:
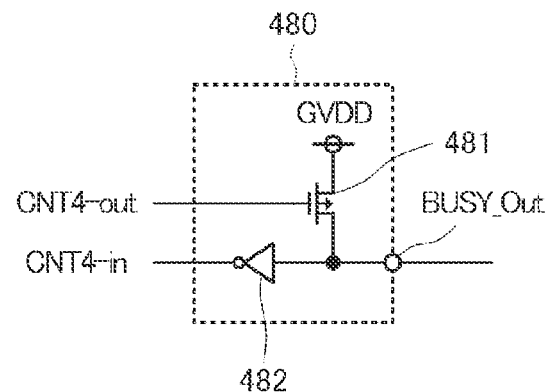
FIG. 17 is a diagram illustrating an example of an electrical configuration of a status signal input/output circuit.

FIG. 17 is a diagram illustrating an example of an electrical configuration of the status signal input/output circuit 480. The status signal input/output circuit 480 includes a transistor 481 and an inverter 482. Note that the description will be made assuming that the transistor 481 is a PMOS transistor. Further, the inverter 482 functions as a COMS input terminal of the integrated circuit 500. That is, the status signal input/output circuit 480 outputs the status signal BUSY from a terminal BUSY-Out based on the control signal CNT4 output from the register control circuit 440, and inputs the signal input to the terminal BUSY-Out to the register control circuit 440. In FIG. 17, the control signal CNT4 output from the register control circuit 440 is illustrated as a control signal CNT4-out, and the control signal CNT4 input to the register control circuit 440 is illustrated as a control signal CNT4-in.

The voltage signal GVDD is supplied to a source terminal of the transistor 481. A drain terminal of the transistor 481 is electrically coupled to an input end of the inverter 482 and the terminal BUSY-Out. The control signal CNT4-out output from the register control circuit 440 is input to a gate terminal of the transistor 481. Further, a control signal CNT4-in input to the register control circuit 440 is output from an output end of the inverter 482. When the control signal CNT4 of L level is input to the status signal input/output circuit 480 configured as described above, the voltage signal GVDD is supplied to the terminal BUSY-Out. That is, the status signal BUSY of H level is output.

Referring back to FIG. 13, the control signal CNT5 is input to the error signal input/output circuit 490. The error signal input/output circuit 490 outputs the error signal ERR indicating whether or not an abnormality has occurred in the drive control circuit 51, and inputs the error signal ERR output from another configuration. Here, the other configuration may be, for example, a different drive control circuit 51 when the liquid ejecting apparatus 1 has a plurality of drive control circuits 51, and may be, for example, the control signal output circuit 100.

Figure 18:
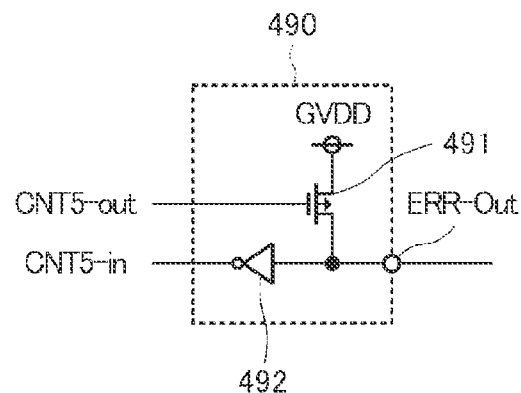
FIG. 18 is a diagram illustrating an example of an electrical configuration of an error signal input/output circuit.

FIG. 18 is a diagram illustrating an example of an electrical configuration of the error signal input/output circuit 490. The error signal input/output circuit 490 includes a transistor 491 and an inverter 492. In the following description, the transistor 491 will be described as a PMOS transistor. Further, the inverter 492 functions as a COMS input terminal of the integrated circuit 500. That is, the error signal input/output circuit 490 outputs the error signal ERR from a terminal ERR-Out based on the control signal CNT5 output from the register control circuit 440, and inputs the signal input to the terminal ERR-Out to the register control circuit 440. In FIG. 18, the control signal CNT5 output from the register control circuit 440 is illustrated as a control signal CNT5-out, and the control signal CNT5 input to the register control circuit 440 is illustrated as a control signal CNT5-in.

The voltage signal GVDD is supplied to a source terminal of the transistor 491. A drain terminal of the transistor 491 is electrically coupled to an input end of the inverter 492 and the terminal ERR-Out. The control signal CNT5-out output from the register control circuit 440 is input to a gate terminal of the transistor 491. A control signal CNT5-in input to the register control circuit 440 is output from an output end of the inverter 492. When the control signal CNT5 of L level is input to the error signal input/output circuit 490 configured as described above, the voltage signal GVDD is supplied to the terminal ERR-Out. That is, the error signal ERR of H level is output.

As described above, since the drive control circuit 51 includes the status signal input/output circuit 480 and the error signal input/output circuit 490, when the liquid ejecting apparatus 1 has a plurality of drive control circuits 51, it is possible to share error information and operation information among the plurality of drive control circuits 51. Therefore, when an abnormality occurs in any of the plurality of drive control circuits 51, it is possible to control the operation of another drive control circuit 51 in which no abnormality has occurred, based on the state information indicating the abnormality.

Referring back to FIG. 13, the register control circuit 440 generates drive data dC for controlling the voltage value of the drive signal COM output from the demodulation circuit 560 to be constant at a voltage Vos, and inputs the drive data to the DAC circuit 520. The voltage Vos, which is the voltage value of the drive signal COM defined by the drive data dC, may be changeable by changing the drive data dC output from the register control circuit 440.

The DAC circuit 520 converts the input drive data dC into the analog base drive signal aA. The base drive signal aA is a target signal before amplification of the drive signal COM having a constant voltage value. The base drive signal aA is input to the modulation circuit 530. The modulation circuit 530 outputs the modulation signal Ms obtained by performing pulse width modulation on the base drive signal aA. The gate drive circuit 540 generates the amplification control signal Hgd that amplifies the input modulation signal Ms based on the voltage signal GVDD and is level-shifted to a high-amplitude logic based on the voltage signal VHVb, and the amplification control signal Lgd that inverts a logic level of the input modulation signal Ms and is amplified based on the voltage signal GVDD. Then, the amplifier circuit 550 operates based on the amplification control signals Hgd and Lgd to output the amplified modulation signal AMs, and the demodulation circuit 560 demodulates the amplified modulation signal AMs. Thereby, the drive signal COM having a constant voltage value is output from the demodulation circuit 560.

The register control circuit 440 generates the drive data dC indicating a constant voltage value to output the drive data to the DAC circuit 520, and generates a switching signal VSEL for switching the modulation circuit 530 to output a voltage signal VSET having a voltage value of a voltage Vset defined by the base drive signal aA based on the drive data dC to the constant voltage output circuit 420, and outputs the switching signal to the modulation circuit 530.

The DAC circuit 520 converts the input drive data dC into the analog base drive signal aA, and outputs the base drive signal to the modulation circuit 530. When the switching signal VSEL input from the register control circuit 440 is a signal indicating that a signal having a voltage value defined by the base drive signal aA is output to the constant voltage output circuit 420, the modulation circuit 530 outputs the voltage signal VSET having a voltage value of the voltage Vset defined by the base drive signal aA to the constant voltage output circuit 420. The constant voltage output circuit 420 generates a voltage signal VCNT having a constant potential of the terminal COM-Out based on the input voltage signal VSET, and outputs the voltage signal VCNT to the terminal COM-Out via the terminal VFB-In and the resistor 571. In other words, the constant voltage output circuit 420 outputs the voltage signal VCNT which is a DC voltage signal for keeping the voltage value of the terminal COM-Out constant.

Figure 19:
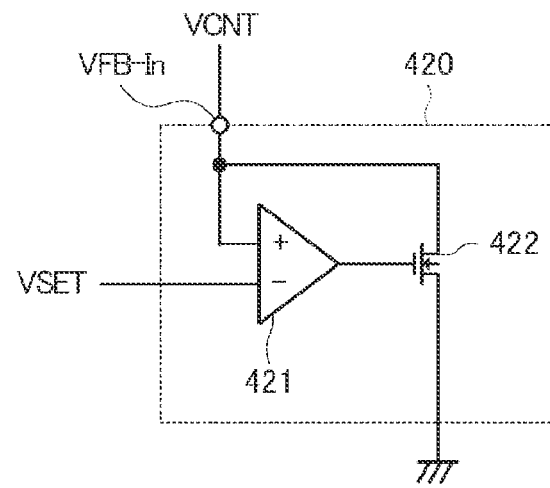
FIG. 19 is a diagram illustrating an example of an electrical configuration of a constant voltage output circuit.

FIG. 19 is a diagram illustrating an example of an electrical configuration of the constant voltage output circuit 420. The constant voltage output circuit 420 includes a comparator 421 and a transistor 422. Note that the transistor 422 will be described as an NMOS transistor.

The voltage signal VSET output from the modulation circuit 530 is input to a − side input end of the comparator 421. A + side input end of the comparator 421 is electrically coupled to the terminal VFB-In. An output end of the comparator 421 is electrically coupled to a gate terminal of the transistor 422. A drain terminal of the transistor 422 is electrically coupled to the terminal VFB-In. Then, the ground potential is supplied to a source terminal of the transistor 422.

Then, when the voltage value supplied to the + side input end of the comparator 421 in the constant voltage output circuit 420 is larger than the voltage Vset which is the voltage value of the voltage signal VSET supplied to the − side input end of the comparator 421, the comparator 421 outputs an H level signal. That is, when the voltage value of the terminal VFB-In is larger than the voltage Vset which is the voltage value of the voltage signal VSET, the comparator 421 outputs an H level signal. Therefore, the transistor 422 is controlled to be conductive. As a result, the voltage value of the terminal VFB-In decreases. On the other hand, when the voltage value supplied to the + side input end of the comparator 421 is smaller than the voltage Vset supplied to the − side input end of the comparator 421, the comparator 421 outputs an L level signal. That is, when the voltage value of the terminal VFB-In is smaller than the voltage Vset which is the voltage value of the voltage signal VSET, the comparator 421 outputs an L level signal. Therefore, the transistor 422 is controlled to be off. As a result, the voltage signal VHV2 is supplied to the terminal VFB-In via the resistor 572, and the voltage value of the terminal VFB-In increases.

That is, the constant voltage output circuit 420 controls the operation of the transistor 422 so that the voltage value of the terminal VFB-In becomes a voltage defined by the voltage Vset which is the voltage value of the voltage signal VSET. In other words, the constant voltage output circuit 420 generates and outputs the voltage signal VCNT whose voltage value defined by the voltage Vset which is the voltage value of the voltage signal VSET is constant at a voltage Vcnt. Thereby, the voltage value of the terminal COM-Out electrically coupled to the terminal VFB-In via the resistor 571 is controlled.

The drive control circuit 51 in the drive circuit 50 configured as described above switches the operation in each of a print mode in which the liquid ejecting apparatus 1 ejects ink from the print head 21 to form an image on the medium P, a standby mode in which the liquid ejecting apparatus 1 does not eject ink from the print head 21, and a sleep mode in which the liquid ejecting apparatus 1 does not eject ink from the print head 21 and power consumption is smaller than that in the standby mode.

When the liquid ejecting apparatus 1 is in the print mode, the drive control circuit 51 in the drive circuit 50 generates and outputs the drive signal COM as illustrated in FIG. 3. Specifically, the integrated circuit 500 in the drive control circuit 51 generates the amplification control signals Hgd and Lgd based on the input drive data signal DATA and outputs the amplification control signals to the amplifier circuit 550. The amplifier circuit 550 operates according to the amplification control signals Hgd and Lgd to generate the amplified modulation signal AMs obtained by amplifying the base drive signal dA according to the drive data signal DATA based on the voltage signal VHVb, and outputs the amplified modulation signal to the demodulation circuit 560. Then, the demodulation circuit 560 demodulates the amplified modulation signal AMs to generate the drive signal COM, which is output from the drive control circuit 51 and the drive circuit 50.

When the liquid ejecting apparatus 1 is in the standby mode, the drive control circuit 51 in the drive circuit 50 generates and outputs the drive signal COM having a constant voltage value. Specifically, the drive data dC is input from the register control circuit 440 to the DAC circuit 520 included in the integrated circuit 500 in the drive control circuit 51. That is, the DAC circuit 520 generates the base drive signal dA according to the drive data dC regardless of the drive data signal DATA, and outputs the base drive signal to the modulation circuit 530. The modulation circuit 530 generates the amplification control signals Hgd and Lgd according to the base drive signal aA, and outputs the amplification control signals to the amplifier circuit 550. Then, the amplifier circuit 550 operates according to the amplification control signals Hgd and Lgd to generate the amplified modulation signal AMs obtained by amplifying the base drive signal dA according to the drive data dC based on the voltage signal VHVb, and outputs the amplified modulation signal to the demodulation circuit 560. Thereafter, the demodulation circuit 560 demodulates the amplified modulation signal AMs to generate the drive signal COM, which is output from the drive control circuit 51 and the drive circuit 50.

In this case, the drive data dC includes information for controlling the drive signal COM at a constant voltage. Specifically, a duty of the amplification control signals Hgd and Lgd generated according to the base drive signal aA based on the drive data dC is fixed. Accordingly, the amplifier circuit 550 generates and outputs the amplified modulation signal AMs with a fixed duty. Therefore, the voltage value of the drive signal COM generated by the demodulation circuit 560 demodulating the amplified modulation signal AMs becomes constant, and as a result, the piezoelectric element 60 does not operate and ink is not ejected from the nozzle.

When the liquid ejecting apparatus 1 is in the sleep mode, the drive control circuit 51 in the drive circuit 50 outputs the voltage signal VCNT generated by the constant voltage output circuit 420 as a drive signal COM, which has a constant voltage value. Specifically, the drive data dC is input from the register control circuit 440 to the DAC circuit 520 included in the integrated circuit 500 in the drive control circuit 51. That is, the DAC circuit 520 generates the base drive signal dA according to the drive data dC regardless of the drive data signal DATA, and outputs the base drive signal to the modulation circuit 530. Further, the modulation circuit 530 receives the switching signal VSEL indicating that the register control circuit 440 outputs a signal having a voltage value defined by the base drive signal aA to the constant voltage output circuit 420. Accordingly, the modulation circuit 530 outputs the voltage signal VSET having a voltage value of the voltage Vset defined by the base drive signal aA based on the drive data dC to the constant voltage output circuit 420. Thereby, the constant voltage output circuit 420 generates the voltage signal VCNT having a constant voltage value, and outputs the voltage signal VCNT to the terminal COM-Out via the terminal VFB-In and the resistor 571. Accordingly, the piezoelectric element 60 is not driven and ink is not ejected. In such a sleep mode, the amplifier circuit 550 does not operate. Therefore, the power consumption in the sleep mode is reduced as compared with the power consumption in the standby mode in which ink is not ejected.

Then, when a predetermined period of time elapses after the liquid ejecting apparatus 1 transitions to the sleep mode, the potential supplied to the electrodes 611 and 612 of the piezoelectric element 60 becomes the ground potential. Specifically, the register control circuit 440 outputs the control signal CNT1 of H level to the drive signal discharge circuit 450, and outputs the control signal CNT2 of H level to the reference voltage signal output circuit 460. When the control signal CNT1 of H level is input to the drive signal discharge circuit 450, the transistor 452 included in the drive signal discharge circuit 450 is controlled to be conductive. As a result, the drive signal discharge circuit 450 discharges the charge based on the drive signal COM supplied to the electrode 611. Further, when the control signal CNT2 of H level is input to the reference voltage signal output circuit 460, the transistor 463 included in the reference voltage signal output circuit 460 is controlled to be conductive. As a result, the reference voltage signal output circuit 460 discharges the charge based on the reference voltage signal VBS supplied to the electrode 612. Thereby, the potential supplied to the electrodes 611 and 612 of the piezoelectric element 60 is controlled to the ground potential.

The sleep mode is likely to continue for a long time as compared with the standby mode. In such a sleep mode, the charges of the electrodes 611 and 612 of the piezoelectric element 60 are discharged, and the potential supplied to the electrodes 611 and 612 of the piezoelectric element 60 is set to the ground potential, whereby unintended charges are not stored in the electrodes 611 and 612 of the piezoelectric element 60, and as a result, the possibility that the piezoelectric element 60 is continuously displaced unintentionally is reduced. Thereby, the possibility that the piezoelectric element 60 and the ejection portion 600 will become abnormal due to continuous unintended displacement of the piezoelectric element 60 is reduced. The liquid ejecting apparatus 1 transitions to the sleep mode, the register control circuit 440 outputs the control signal CNT1 of H level to the drive signal discharge circuit 450, and outputs the control signal CNT2 of H level to the reference voltage signal output circuit 460, and then, the constant voltage output circuit 420 may output the voltage signal VCNT having a constant voltage value at the ground potential. In other words, the liquid ejecting apparatus 1 transitions to the sleep mode, the register control circuit 440 outputs the control signal CNT1 of H level to the drive signal discharge circuit 450, and outputs the control signal CNT2 of H level to the reference voltage signal output circuit 460, and then, the constant voltage output circuit 420 may stop operating.

Here, a configuration including the modulation circuit 530, the amplifier circuit 550, and the demodulation circuit 560 that output the drive signal COM, and the constant voltage output circuit 420 that outputs the voltage signal VCNT having a constant voltage value at the voltage Vcnt may be referred to as a drive signal output circuit 501. The terminal VFB-In to which the feedback signal VFB is input is an example of the input terminal.

4.4 Configuration and Operation of Integrated Circuit

Figure 20:
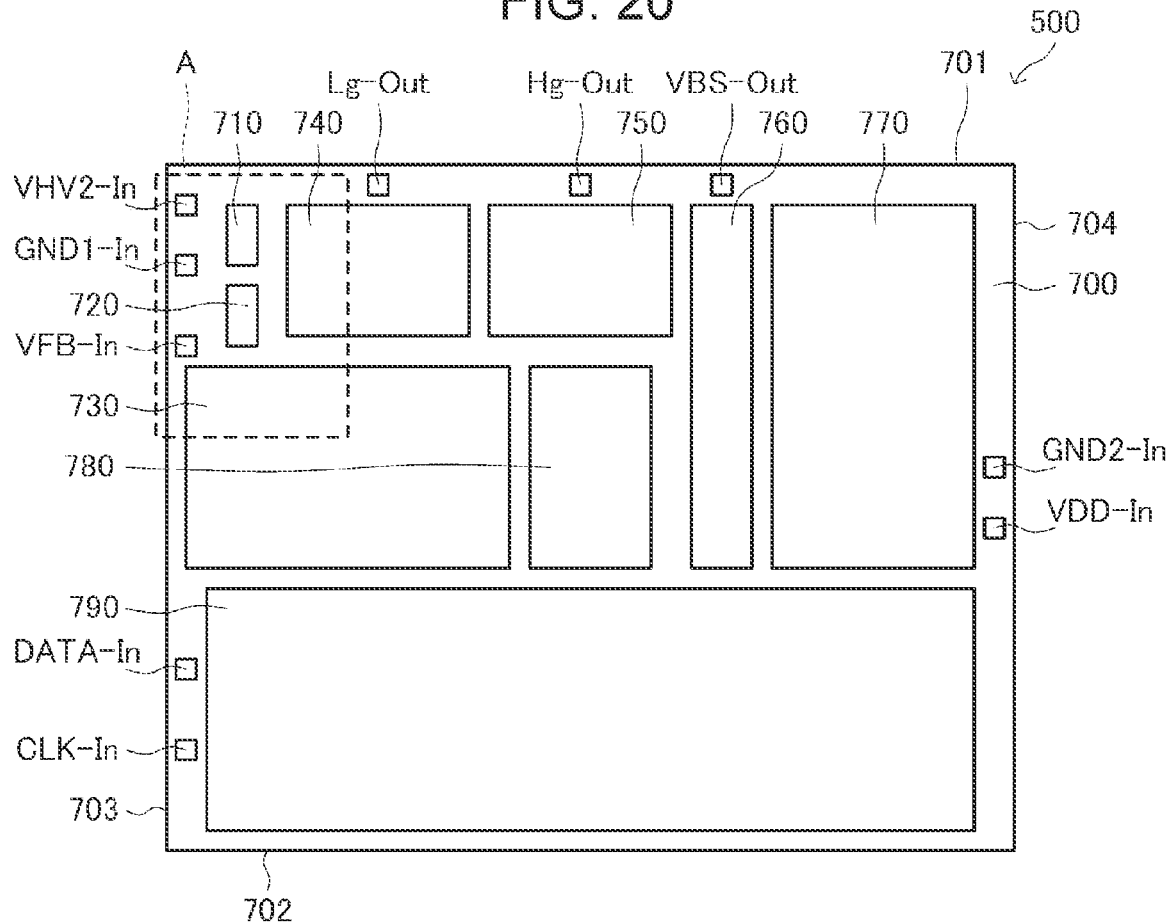
FIG. 20 is a diagram illustrating an example of a circuit layout of an integrated circuit.

Next, the arrangement of various circuits and terminals included in the integrated circuit 500 will be described. FIG. 20 is a diagram illustrating an example of a circuit layout of the integrated circuit 500. The integrated circuit 500 includes a substantially rectangular substrate 700 which includes opposing sides 701 and 702 and opposing sides 703 and 704, and of which the side 701 is orthogonal to the sides 703 and 704, and the side 702 is orthogonal to the sides 703 and 704. Here, the substrate 700 is configured to include, for example, silicon. Note that the shape of the substrate 700 is not limited to a rectangular shape, and a notch or an arc may be partially formed, and further, a polygon such as a pentagon or a hexagon may be used.

As illustrated in FIG. 20, the substrate 700 in the integrated circuit 500 is provided with a plurality of terminals for electrically coupling to an internal circuit of the integrated circuit 500 and an external circuit of the integrated circuit 500. Specifically, the substrate 700 in the integrated circuit 500 according to the present embodiment is provided with a plurality of terminals including the terminals CLK-In, DATA-In, Hg-Out, Lg-Out, VFB-In, and VBS-Out illustrated in FIG. 13, a terminal VHV2-In to which the voltage signal VHV2 is input, a terminal GND1-In indicating a reference potential of the voltage signal VHV, a terminal VDD-In to which the voltage signal VDD is input, and a terminal GND2-In indicating a reference potential of the voltage signal VDD.

In addition, the substrate 700 in the integrated circuit 500 is provided with a plurality of circuit mounting areas in which various circuits included in the integrated circuit 500 are mounted. Specifically, the substrate 700 in the integrated circuit 500 according to the present embodiment is provided with a plurality of circuit mounting areas including a discharge circuit mounting area 710, a constant voltage circuit mounting area 720, a modulation circuit mounting area 730, a first gate drive circuit mounting area 740, a second gate drive circuit mounting area 750, a reference voltage circuit mounting area 760, an internal voltage circuit mounting area 770, a DAC circuit mounting area 780, and a logic circuit mounting area 790. Note that the substrate 700 in the integrated circuit 500 may be provided with a terminal and a circuit mounting area other than the above-described terminals and circuit mounting areas. In FIG. 20, some of the terminals and the circuits illustrated in FIG. 13 are not illustrated.

The terminals VHV2-In, GND1-In, VFB-In, DATA-In, and CLK-In among the plurality of terminals provided on the substrate 700 are provided side by side in the direction along the side 703 of the substrate 700. Specifically, the terminals VHV2-In, GND1-In, VFB-In, DATA-In, and CLK-In are provided side by side in this order in the direction along the side 703 of the substrate 700 and along the direction from the side 701 to the side 702.

In addition, the terminals Hg-Out, Lg-Out, and VBS-Out among the plurality of terminals provided on the substrate 700 are provided side by side in the direction along the side 701 of the substrate 700. Specifically, the terminals Lg-Out, Hg-Out, and VBS-Out are provided side by side in this order on the side 704 side of the terminals VHV2-In, GND1-In, VFB-In, DATA-In, and CLK-In provided side by side in the direction along the side 703 of the substrate 700 and along the direction from the side 703 to the side 704 in the direction along the side 701 of the substrate 700.

In addition, the terminals VDD-In and GND2-In among the plurality of terminals provided on the substrate 700 are provided side by side in the direction along the side 704 of the substrate 700. Specifically, the terminals GND2-In and VDD-In are provided side by side in this order on the side 704 side of the terminals Hg-Out, Lg-Out, and VBS-Out provided side by side in the direction along the side 701 of the substrate 700 and along the direction from the side 701 to the side 702 in the direction along the side 704 of the substrate 700.

At least a part of the discharge circuit mounting area 710 among the plurality of circuit mounting areas provided on the substrate 700 is located on the side 704 side of the terminals VHV2-In and GND1-In. In the discharge circuit mounting area 710, the drive signal discharge circuit 450 illustrated in FIG. 13 is mounted.

In addition, at least a part of the constant voltage circuit mounting area 720 among the plurality of circuit mounting areas provided on the substrate 700 is located on the side 704 side of the terminals GND1-In and VFB-In and on the side 702 side of the discharge circuit mounting area 710. That is, the discharge circuit mounting area 710 and the constant voltage circuit mounting area 720 are provided side by side in the direction along the side 703 of the substrate 700. In the constant voltage circuit mounting area 720, the constant voltage output circuit 420 illustrated in FIG. 13 is mounted.

In addition, at least a part of the first gate drive circuit mounting area 740 among the plurality of circuit mounting areas provided on the substrate 700 is located on the side 704 side of the discharge circuit mounting area 710 and the constant voltage circuit mounting area 720 and on the side 702 side of the terminal Lg-Out. In this case, the first gate drive circuit mounting area 740 is located in the vicinity of the terminal Lg-Out. In the first gate drive circuit mounting area 740, a circuit that outputs the amplification control signal Lgd in the gate drive circuit 540 illustrated in FIG. 13 is mounted. With the configuration, it is possible to shorten the length of the wiring through which the amplification control signal Lgd is propagated inside the integrated circuit 500.

In addition, at least a part of the second gate drive circuit mounting area 750 among the plurality of circuit mounting areas provided on the substrate 700 is located on the side 704 side of the first gate drive circuit mounting area 740 and on the side 702 side of the terminal Hg-Out. In this case, the second gate drive circuit mounting area 750 is located in the vicinity of the terminal Hg-Out. In the second gate drive circuit mounting area 750, a circuit that outputs the amplification control signal Hgd in the gate drive circuit 540 illustrated in FIG. 13 is mounted. With the configuration, it is possible to shorten the length of the wiring through which the amplification control signal Hgd is propagated inside the integrated circuit 500.

In addition, at least a part of the modulation circuit mounting area 730 among the plurality of circuit mounting areas provided on the substrate 700 is located between the terminal VFB-In and the terminal DATA-In and on the side 702 side of the constant voltage circuit mounting area 720 and the side 702 side of the first gate drive circuit mounting area 740. In the modulation circuit mounting area 730, the modulation circuit 530 illustrated in FIG. 13 is mounted.

In addition, at least a part of the DAC circuit mounting area 780 among the plurality of circuit mounting areas provided on the substrate 700 is located on the side 702 side of the second gate drive circuit mounting area 750. In the DAC circuit mounting area 780, the DAC circuit 520 illustrated in FIG. 13 is mounted.

In addition, at least a part of the reference voltage circuit mounting area 760 among the plurality of circuit mounting areas provided on the substrate 700 is located on the side 704 side of the second gate drive circuit mounting area 750 and the side 704 side of the DAC circuit mounting area 780 and on the side 702 side of the terminal VBS-Out. In this case, the reference voltage circuit mounting area 760 is located in the vicinity of the terminal VBS-Out. In the reference voltage circuit mounting area 760, the reference voltage signal output circuit 460 illustrated in FIG. 13 is mounted. With the configuration, it is possible to shorten the length of the wiring through which the reference voltage signal VBS is propagated inside the integrated circuit 500.

In addition, at least a part of the internal voltage circuit mounting area 770 among the plurality of circuit mounting areas provided on the substrate 700 is located on the side 704 side of the reference voltage circuit mounting area 760. The terminal VDD-In and the terminal GND2-In are located on the side 704 side of the internal voltage circuit mounting area 770. In the internal voltage circuit mounting area 770, the internal voltage generation circuit 400 illustrated in FIG. 13 is mounted.

In addition, at least a part of the logic circuit mounting area 790 among the plurality of circuit mounting areas provided on the substrate 700 is located on the side 702 side of the modulation circuit mounting area 730, the DAC circuit mounting area 780, the reference voltage circuit mounting area 760, and the internal voltage circuit mounting area 770. The terminals DATA-In and CLK-In are located on the side 703 side of the logic circuit mounting area 790. In the logic circuit mounting area 790, the plurality of logic circuits including the register control circuit 440, the VHV control signal output circuit 470, the status signal input/output circuit 480, and the error signal input/output circuit 490 illustrated in FIG. 13 are mounted.

Here, as illustrated in FIG. 13, the voltage signal VCNT output from the constant voltage output circuit 420 is output to the outside of the integrated circuit 500 via the terminal VFB-In, the drive signal discharge circuit 450 discharges the charge based on the drive signal COM via the terminal VFB-In, and the feedback signal VFB is input to the modulation circuit 530 via the terminal VFB-In. That is, the terminal VFB-In is electrically coupled to the constant voltage output circuit 420, the drive signal discharge circuit 450, and the modulation circuit 530, and the constant voltage output circuit 420, the drive signal discharge circuit 450, and the modulation circuit 530 are electrically coupled to each other. In other words, the terminal VFB-In is electrically coupled to the discharge circuit mounting area 710 in which the drive signal discharge circuit 450 is mounted, the constant voltage circuit mounting area 720 in which the constant voltage output circuit 420 is mounted, and the modulation circuit mounting area 730 in which the modulation circuit 530 is mounted.

Therefore, signals input to or output from each of the discharge circuit mounting area 710 in which the drive signal discharge circuit 450 is mounted, the constant voltage circuit mounting area 720 in which the constant voltage output circuit 420 is mounted, and the modulation circuit mounting area 730 in which the modulation circuit 530 is mounted are highly likely to interfere with each other. In other words, in order to reduce the possibility of malfunction occurring inside the integrated circuit 500 due to signal interference, it is effective to properly arrange, inside the integrated circuit 500, the discharge circuit mounting area 710 in which the drive signal discharge circuit 450 is mounted, the constant voltage circuit mounting area 720 in which the constant voltage output circuit 420 is mounted, the modulation circuit mounting area 730 in which the modulation circuit 530 is mounted, and the terminal VFB-In electrically coupled to the drive signal discharge circuit 450, the constant voltage output circuit 420, and the modulation circuit 530.

Figure 21:
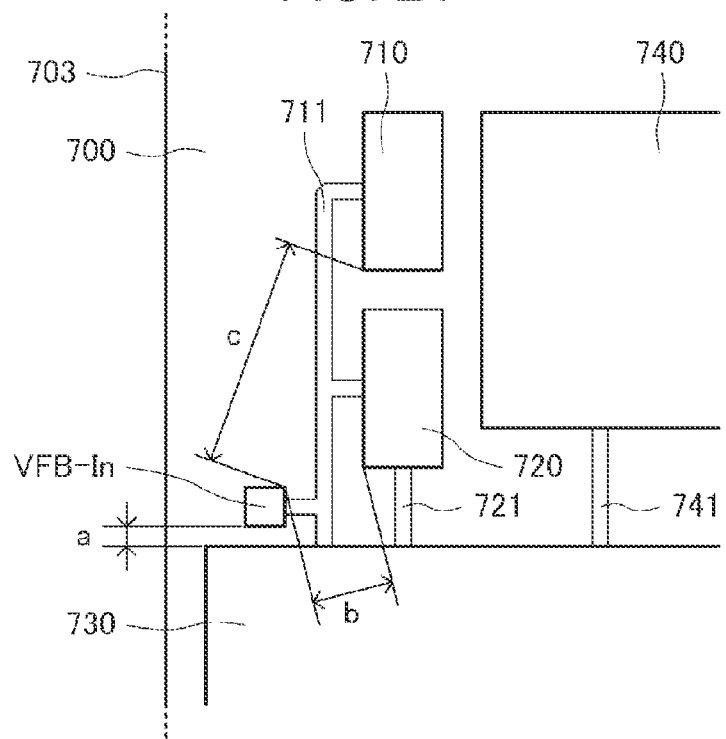
FIG. 21 is an enlarged view of a portion A illustrated in FIG. 20.
Figure 22:
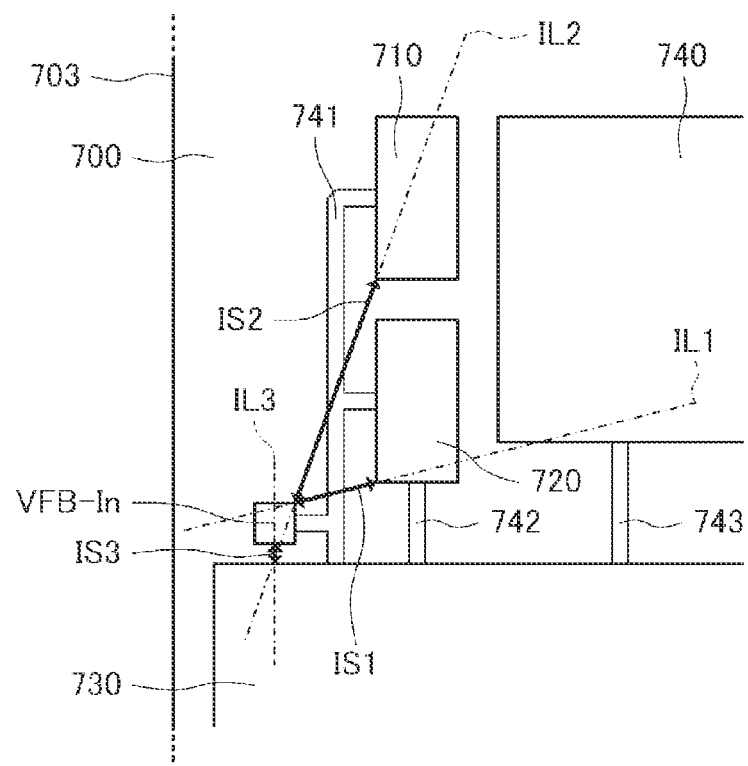
FIG. 22 is an enlarged view of the portion A illustrated in FIG. 20.
Figure 23:
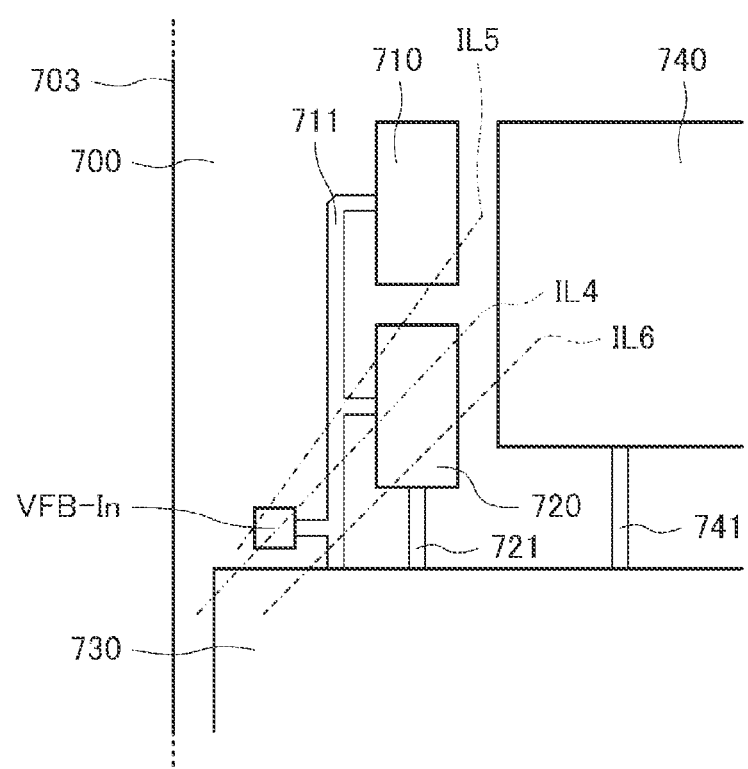
FIG. 23 is an enlarged view of the portion A illustrated in FIG. 20.

Therefore, with reference to FIGS. 20 to 23, a description will be given of a proper arrangement relationship among the discharge circuit mounting area 710, the constant voltage circuit mounting area 720, the modulation circuit mounting area 730, and the terminal VFB-In inside the integrated circuit 500. FIGS. 21 to 23 are enlarged views of a portion A illustrated in FIG. 20. In FIGS. 21 to 23, wirings 741, 742, and 743 are illustrated.

As illustrated in FIG. 21, in the vicinity of the terminal VFB-In, the discharge circuit mounting area 710 in which the drive signal discharge circuit 450 is mounted, the constant voltage circuit mounting area 720 in which the constant voltage output circuit 420 is mounted, and the modulation circuit mounting area 730 in which the modulation circuit 530 is mounted, which are electrically coupled to the terminal VFB-In, are located. Then, the discharge circuit mounting area 710, the constant voltage circuit mounting area 720, the modulation circuit mounting area 730, and the terminal VFB-In are electrically coupled by the wiring 741, and the constant voltage circuit mounting area 720 and the modulation circuit mounting area 730 are electrically coupled by the wiring 742. That is, the constant voltage output circuit 420 and the drive signal discharge circuit 450 are electrically coupled to the terminal VFB-In, the modulation circuit 530 and the constant voltage output circuit 420 are electrically coupled to the terminal VFB-In, and the constant voltage output circuit 420 and the modulation circuit 530 are electrically coupled to each other.

Then, the voltage signal VCNT output from the constant voltage output circuit 420, the feedback signal VFB input to the modulation circuit 530, and the charge based on the drive signal COM discharged by the drive signal discharge circuit 450 are propagated through the wiring 741, and the voltage signal VSET output from the modulation circuit 530 is propagated through the wiring 742.

As illustrated in FIGS. 20 and 21, the modulation circuit mounting area 730 is located on the side 702 side of the terminal VFB-In at a position where the shortest distance from the terminal VFB-In is a distance a. The constant voltage circuit mounting area 720 is located on the side 704 side of the terminal VFB-In at a position where the shortest distance from the terminal VFB-In is a distance b. Further, the discharge circuit mounting area 710 is located on the side 701 side of the constant voltage circuit mounting area 720 at a position where the shortest distance from the terminal VFB-In is a distance c.

In this case, the constant voltage circuit mounting area 720 is located between the modulation circuit mounting area 730 and the discharge circuit mounting area 710. In other words, at least a part of the constant voltage output circuit 420 is located between the modulation circuit 530 and the drive signal discharge circuit 450. That is, the shortest distance between the modulation circuit 530 and the constant voltage output circuit 420 is shorter than the shortest distance between the modulation circuit 530 and the drive signal discharge circuit 450.

With the configuration, it is possible to shorten the wiring length of the wiring 742 through which the voltage signal VSET output from the modulation circuit 530 to the constant voltage output circuit 420 is propagated. Accordingly, the influence of wiring impedance on the voltage signal VSET input to the constant voltage output circuit 420 is reduced, and the possibility that the accuracy of the voltage signal VSET input to the constant voltage output circuit 420 decreases is reduced. As a result, the possibility that the accuracy of the voltage signal VCNT which is generated in the constant voltage output circuit 420 based on the voltage signal VSET and is supplied to the electrode 611 of the piezoelectric element 60 decreases is reduced. That is, the stability of the operation of the integrated circuit 500 is improved.

Further, each of the discharge circuit mounting area 710, the constant voltage circuit mounting area 720, and the modulation circuit mounting area 730 is located so that the distance from the terminal VFB-In becomes longer in the order of the modulation circuit mounting area 730, the constant voltage circuit mounting area 720, and the discharge circuit mounting area 710. That is, of the discharge circuit mounting area 710, the constant voltage circuit mounting area 720, and the modulation circuit mounting area 730, the modulation circuit mounting area 730 is located closest to the terminal VFB-In, the constant voltage circuit mounting area 720 is located in the vicinity of the terminal VFB-In next to the modulation circuit mounting area 730, and the discharge circuit mounting area 710 is located farthest from the terminal VFB-In.

In other words, the distance a which is the shortest distance between the terminal VFB-In and the modulation circuit 530 is shorter than the distance b which is the shortest distance between the terminal VFB-In and the constant voltage output circuit 420, and the distance b which is the shortest distance between the terminal VFB-In and the constant voltage output circuit 420 is shorter than the distance c which is the shortest distance between the terminal VFB-In and the drive signal discharge circuit 450.

The feedback signal VFB output from the feedback circuit 570 is input to the modulation circuit 530. Then, the amplification control signal generation circuit 502 including the modulation circuit 530 performs self-oscillation based on the feedback signal VFB input from the feedback circuit 570. When the waveform of the feedback signal VFB is distorted, the self-oscillation of the amplification control signal generation circuit 502 is disturbed, and as a result, the waveform of the drive signal COM output from the drive circuit 50 is distorted. That is, when the waveform of the feedback signal VFB is distorted, there is a possibility that the ink ejection accuracy in the liquid ejecting apparatus 1 may decrease. For such a problem, by arranging the modulation circuit mounting area 730 in which the modulation circuit 530 is mounted in the vicinity of the terminal VFB-In, it is possible to shorten the length of the wiring through which the feedback signal VFB is propagated inside the integrated circuit 500. Therefore, the influence of wiring impedance on the feedback signal VFB is reduced, and the possibility that noise is superimposed on the feedback signal VFB is reduced. That is, the stability of the operation of the integrated circuit 500 is further improved. As a result, the possibility that the accuracy of the feedback signal VFB input to the modulation circuit 530 decreases is reduced, and the possibility that the ink ejection accuracy in the liquid ejecting apparatus 1 decreases is reduced.

Further, the constant voltage circuit mounting area 720 in which the constant voltage output circuit 420 is mounted is located in the vicinity of the terminal VFB-In next to the modulation circuit mounting area 730 in which the modulation circuit 530 is mounted, so that it is possible to shorten the length of the wiring through which the voltage signal VCNT input from the constant voltage output circuit 420 to the terminal VFB-In is propagated. Accordingly, the influence of wiring impedance on the voltage signal VCNT output from the constant voltage output circuit 420 is reduced. That is, the possibility that the accuracy of the voltage signal VCNT supplied to the electrode 611 of the piezoelectric element 60 decreases is reduced. Accordingly, the stability of the operation of the integrated circuit 500 is further improved.

The discharge circuit mounting area 710, the constant voltage circuit mounting area 720, the modulation circuit mounting area 730, and the terminal VFB-In provided as described above are collectively located on the substrate 700 of the integrated circuit 500 as illustrated in FIGS. 20 and 22. Also, the first gate drive circuit mounting area 740 that performs a switching operation is not located between the circuit mounting areas of each of the discharge circuit mounting area 710, the constant voltage circuit mounting area 720, the modulation circuit mounting area 730, and the terminal VFB-In, which are collectively located.

Specifically, a virtual line segment IS1 located between the terminal VFB-In and the constant voltage circuit mounting area 720 in a virtual straight line IL1 connecting the terminal VFB-In and the constant voltage circuit mounting area 720 in which the constant voltage output circuit 420 is mounted at the shortest distance does not intersect the first gate drive circuit mounting area 740 in which the gate drive circuit 540 is mounted, a virtual line segment IS2 located between the terminal VFB-In and the discharge circuit mounting area 710 in a virtual straight line IL2 connecting the terminal VFB-In and the discharge circuit mounting area 710 in which the drive signal discharge circuit 450 is mounted at the shortest distance does not intersect the first gate drive circuit mounting area 740 in which the gate drive circuit 540 is mounted, and a virtual line segment IS3 located between the terminal VFB-In and the modulation circuit mounting area 730 in a virtual straight line IL3 connecting the terminal VFB-In and the modulation circuit mounting area 730 in which the modulation circuit 530 is mounted at the shortest distance does not intersect the first gate drive circuit mounting area 740 in which the gate drive circuit 540 is mounted.

With the configuration, the possibility that the wiring length of the wiring 741 for electrically coupling the terminal VFB-In, the discharge circuit mounting area 710, the constant voltage circuit mounting area 720, and the modulation circuit mounting area 730 to each another becomes long is reduced, and the possibility that noise generated in the first gate drive circuit mounting area 740 that is not electrically coupled to the wiring 741 on the wiring 741 is superimposed on the discharge circuit mounting area 710, the constant voltage circuit mounting area 720, the modulation circuit mounting area 730, and the wiring 741 is reduced. Therefore, the possibility that the discharge accuracy of the charge based on the drive signal COM by the drive signal discharge circuit 450, the accuracy of the voltage signal VCNT output from the constant voltage output circuit 420, and the accuracy of the feedback signal VFB input to the modulation circuit 530 decrease is reduced. That is, the stability of the operation of the integrated circuit 500 is improved.

Furthermore, in the substrate 700 of the integrated circuit 500, the modulation circuit mounting area 730 is not located between the terminal VFB-In and the constant voltage circuit mounting area 720, and the constant voltage circuit mounting area 720 is not located between the terminal VFB-In and the modulation circuit mounting area 730. Specifically, the virtual line segment IS1 located between the terminal VFB-In and the constant voltage circuit mounting area 720 in the virtual straight line IL1 connecting the terminal VFB-In and the constant voltage circuit mounting area 720 in which the constant voltage output circuit 420 is mounted at the shortest distance does not intersect the modulation circuit mounting area 730 in which the modulation circuit 530 is mounted, and the virtual line segment IS3 located between the terminal VFB-In and the modulation circuit mounting area 730 in the virtual straight line IL3 connecting the terminal VFB-In and the modulation circuit mounting area 730 in which the modulation circuit 530 is mounted at the shortest distance does not intersect the constant voltage circuit mounting area 720 in which the constant voltage output circuit 420 is mounted.

With the configuration, the length of the wiring through which the feedback signal VFB is propagated from the terminal VFB-In to the modulation circuit 530 and the length of the wiring through which the voltage signal VCNT is propagated from the constant voltage output circuit 420 to the terminal VFB-In do not increase, and the wiring through which the feedback signal VFB is propagated from the terminal VFB-In to the modulation circuit 530 and the wiring through which the voltage signal VCNT is propagated from the constant voltage output circuit 420 to the terminal VFB-In can be branched. Accordingly, the possibility that noise caused by the operation of the constant voltage output circuit 420 is superimposed on the feedback signal VFB is reduced and the possibility that noise caused by the operation of the modulation circuit 530 is superimposed on the voltage signal VCNT is reduced. Thereby, the possibility that the accuracy of the feedback signal VFB and the voltage signal VCNT decreases is reduced. That is, the stability of the operation of the integrated circuit 500 is improved.

Here, as illustrated in FIGS. 20 and 23, in the terminal VFB-In, the modulation circuit mounting area 730 in which the modulation circuit 530 is mounted, and the constant voltage circuit mounting area 720 in which the constant voltage output circuit 420 is mounted, at least a part of the terminal VFB-In is preferably located between the modulation circuit mounting area 730 and the constant voltage circuit mounting area 720 in the direction along a virtual straight line IL4.

Specifically, the modulation circuit mounting area 730, the constant voltage circuit mounting area 720, and the terminal VFB-In are provided side by side in the order of the modulation circuit mounting area 730, the terminal VFB-In, and the constant voltage circuit mounting area 720 in the direction along the virtual straight line IL4. In other words, the modulation circuit mounting area 730, the terminal VFB-In, and the constant voltage circuit mounting area 720 are located side by side in this order so that at least a part of the modulation circuit mounting area 730, at least a part of the constant voltage circuit mounting area 720, and at least a part of the terminal VFB-In overlap one virtual straight line IL4.

Thereby, the possibility that noise caused by the operation of the constant voltage output circuit 420 is superimposed on the feedback signal VFB is further reduced and the possibility that noise caused by the operation of the modulation circuit 530 is superimposed on the voltage signal VCNT is further reduced. That is, the possibility that the accuracy of the feedback signal VFB and the voltage signal VCNT decreases is further reduced.

Further, the discharge circuit mounting area 710 in which the drive signal discharge circuit 450 is mounted, the constant voltage circuit mounting area 720 in which the constant voltage output circuit 420 is mounted, and the terminal VFB-In are provided side by side in the order of the terminal VFB-In, the constant voltage circuit mounting area 720, and the discharge circuit mounting area 710 in the direction along a virtual straight line IL5. Then, the terminal VFB-In, the constant voltage circuit mounting area 720, and the discharge circuit mounting area 710 are located side by side in this order so that at least a part of the discharge circuit mounting area 710, at least a part of the constant voltage circuit mounting area 720, and at least a part of the terminal VFB-In overlap one virtual straight line IL5. In other words, in the direction along the virtual straight line IL5, at least a part of the constant voltage circuit mounting area 720 in which the constant voltage output circuit 420 is mounted is located between the terminal VFB-In and the discharge circuit mounting area 710 in which the drive signal discharge circuit 450 is mounted.

With the configuration, it is possible to shorten the length of the wiring through which the voltage signal VCNT input from the constant voltage output circuit 420 to the terminal VFB-In is propagated, and it is possible to reduce the area occupied by the terminal VFB-In, the constant voltage circuit mounting area 720, the discharge circuit mounting area 710, and the wiring 741 on the substrate 700. That is, it is possible to stabilize the operation of the integrated circuit 500 and reduce the size of the integrated circuit 500.

Further, the modulation circuit mounting area 730 in which the modulation circuit 530 is mounted, the constant voltage circuit mounting area 720 in which the constant voltage output circuit 420 is mounted, and the first gate drive circuit mounting area 740 in which the gate drive circuit 540 is mounted are provided side by side in the order of the modulation circuit mounting area 730, the constant voltage circuit mounting area 720, and the first gate drive circuit mounting area 740 in the direction along a virtual straight line IL6. That is, the modulation circuit mounting area 730, the constant voltage circuit mounting area 720, and the first gate drive circuit mounting area 740 are located side by side in this order so that at least a part of the modulation circuit mounting area 730, at least a part of the constant voltage circuit mounting area 720, and at least a part of the first gate drive circuit mounting area 740 overlap one virtual straight line IL6. In other words, in the direction along the virtual straight line IL6, at least a part of the constant voltage circuit mounting area 720 in which the constant voltage output circuit 420 is mounted is located between the modulation circuit mounting area 730 in which the modulation circuit 530 is mounted and the first gate drive circuit mounting area 740 in which the gate drive circuit 540 is mounted.

With the configuration, it is possible to shorten the length of the wiring through which the voltage signal VSET is propagated from the modulation circuit 530 to the constant voltage output circuit 420, and the possibility that noise generated due to the operation of the gate drive circuit 540 is superimposed on the modulation circuit 530 and the wiring 742 is reduced. As a result, the possibility that the accuracy of the voltage signal VSET output from the modulation circuit 530 to the constant voltage output circuit 420 decreases is reduced. Accordingly, the accuracy of the voltage signal VCNT which is generated in the constant voltage output circuit 420 based on the voltage signal VSET and is supplied to the electrode 611 of the piezoelectric element 60 is improved. That is, the stability of the operation of the integrated circuit 500 is improved.

Here, the virtual straight line IL1 is an example of a first virtual straight line, the virtual straight line IL3 is an example of a second virtual straight line, the virtual line segment IS1 is an example of a first virtual line segment, and the virtual line segment IS3 is an example of a second virtual line segment.

5. Effect

In the liquid ejecting apparatus 1, the drive circuit 50, and the integrated circuit 500 according to the present embodiment described above, the virtual line segment IS1 located between the terminal VFB-In and the constant voltage output circuit 420 in the virtual straight line IL1 connecting the terminal VFB-In and the constant voltage output circuit 420 at the shortest distance does not intersect the modulation circuit 530, and the virtual line segment IS3 located between the terminal VFB-In and the modulation circuit 530 in the virtual straight line IL3 connecting the terminal VFB-In and the modulation circuit 530 at the shortest distance does not intersect the constant voltage output circuit 420. With the configuration, the wiring through which the voltage signal VCNT is propagated from the constant voltage output circuit 420 to the terminal VFB-In and the wiring through which the feedback signal VFB is propagated from the terminal VFB-In to the modulation circuit 530 can be arranged in a branched manner. Therefore, the possibility that noise caused by the operation of the constant voltage output circuit 420 is superimposed on the feedback signal VFB is reduced and the possibility that noise caused by the operation of the modulation circuit 530 is superimposed on the voltage signal VCNT is reduced. That is, the possibility that the accuracy of the feedback signal VFB and the voltage signal VCNT decreases is reduced. Therefore, the stability of the operation of the integrated circuit 500 in which the terminal VFB-In, the modulation circuit 530, and the constant voltage output circuit 420 are arranged is improved so that the accuracy of the feedback signal VFB and the voltage signal VCNT decreases is reduced.

The embodiments have been described above, but the present disclosure is not limited to these embodiments and can be carried out in various modes without departing from the scope of the disclosure. For example, it is possible to combine the above-described embodiments as appropriate.

The present disclosure includes configurations that are substantially the same as the configurations described in the embodiments (for example, configurations having the same function, method, and result, or configurations having the same object and effect). Further, the present disclosure includes configurations in which non-essential parts of the configurations described in the embodiments are replaced. In addition, the present disclosure includes configurations that achieve the same effect as the configurations described in the embodiments or configurations that can achieve the same object. Further, the present disclosure includes configurations in which known techniques are added to the configurations described in the embodiments.

The following contents are derived from the above-described embodiment.

According to an aspect, there is provided a liquid ejecting apparatus including a liquid ejecting head having a drive element, and ejecting a liquid by supplying a drive signal to the drive element, and a drive circuit that outputs the drive signal. The drive circuit includes an integrated circuit that outputs an amplification control signal based on a base drive signal, an amplifier circuit that operates according to the amplification control signal to output an amplified modulation signal, a demodulation circuit that demodulates the amplified modulation signal to output the drive signal, and a feedback circuit that feeds back a feedback signal based on the drive signal to the integrated circuit. The integrated circuit includes a modulation circuit that modulates the base drive signal to output a modulation signal, a switching circuit that outputs the amplification control signal according to the modulation signal, a constant voltage output circuit that outputs a DC voltage signal, and an input terminal to which the feedback signal is input. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

According to the liquid ejecting apparatus, in the integrated circuit, the first virtual line segment located between the input terminal and the constant voltage output circuit in the first virtual straight line connecting the input terminal and the constant voltage output circuit at the shortest distance does not intersect the modulation circuit, and the second virtual line segment located between the input terminal and the modulation circuit in the second virtual straight line connecting the input terminal and the modulation circuit at the shortest distance does not intersect the constant voltage output circuit. With the configuration, the wiring through which the DC voltage signal is propagated from the constant voltage output circuit to the input terminal and the wiring through which the feedback signal is propagated from the input terminal to the modulation circuit can be arranged in a branched manner. Accordingly, the possibility that noise caused by the operation of the constant voltage output circuit is superimposed on the modulation signal is reduced and the possibility that noise caused by the operation of the modulation circuit is superimposed on the DC voltage signal is reduced. That is, the possibility that the accuracy of the modulation signal and the DC voltage signal decreases is reduced. Therefore, the stability of the operation of the integrated circuit in which the input terminal, the modulation circuit, and the constant voltage output circuit are arranged is improved so that the possibility that the accuracy of the modulation signal and the DC voltage signal decreases is reduced.

In the aspect of the liquid ejecting apparatus, the shortest distance between the input terminal and the modulation circuit may be shorter than the shortest distance between the input terminal and the constant voltage output circuit.

According to the liquid ejecting apparatus, in the integrated circuit, it is possible to shorten the wiring through which the feedback signal input to the input terminal is propagated to the modulation circuit. Therefore, it is possible to further reduce the possibility that noise is superimposed on the feedback signal.

In the aspect of the liquid ejecting apparatus, the input terminal may be located between the modulation circuit and the constant voltage output circuit.

According to the liquid ejecting apparatus, in the integrated circuit, it is possible to shorten the wiring through which the feedback signal input to the input terminal is propagated to the modulation circuit, and to shorten the wiring through which the DC voltage signal output from the constant voltage output circuit is propagated to the input terminal. Therefore, it is possible to further reduce the possibility that noise is superimposed on the feedback signal and the DC voltage signal.

In the aspect of the liquid ejecting apparatus, the first virtual line segment may not intersect the switching circuit.

According to the liquid ejecting apparatus, since the switching circuit is not located between the input terminal and the constant voltage output circuit in the integrated circuit, it is possible to shorten the wiring through which the DC voltage signal output from the constant voltage output circuit is propagated to the input terminal, and the possibility that noise generated in the switching circuit is superimposed on the DC voltage signal is reduced. Therefore, it is possible to further reduce the possibility that the accuracy of the DC voltage signal decreases.

In the aspect of the liquid ejecting apparatus, the second virtual line segment may not intersect the switching circuit.

According to the liquid ejecting apparatus, since the switching circuit is not located between the input terminal and the modulation circuit in the integrated circuit, it is possible to shorten the wiring through which the feedback signal input to the modulation circuit is propagated, and the possibility that noise generated in the switching circuit is superimposed on the feedback signal is reduced. Therefore, it is possible to further reduce the possibility that the accuracy of the feedback signal decreases.

According to another aspect, there is provided a drive circuit that outputs a drive signal for driving a capacitive load. The drive circuit includes an integrated circuit that outputs an amplification control signal based on a base drive signal, an amplifier circuit that operates according to the amplification control signal to output an amplified modulation signal, a demodulation circuit that demodulates the amplified modulation signal to output the drive signal, and a feedback circuit that feeds back a feedback signal based on the drive signal to the integrated circuit. The integrated circuit includes a modulation circuit that modulates the base drive signal to output a modulation signal, a switching circuit that outputs the amplification control signal according to the modulation signal, an input terminal to which the feedback signal is input, and a constant voltage output circuit that outputs a DC voltage signal. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

According to the drive circuit, in the integrated circuit, the first virtual line segment located between the input terminal and the constant voltage output circuit in the first virtual straight line connecting the input terminal and the constant voltage output circuit at the shortest distance does not intersect the modulation circuit, and the second virtual line segment located between the input terminal and the modulation circuit in the second virtual straight line connecting the input terminal and the modulation circuit at the shortest distance does not intersect the constant voltage output circuit. With the configuration, the wiring through which the DC voltage signal is propagated from the constant voltage output circuit to the input terminal and the wiring through which the feedback signal is propagated from the input terminal to the modulation circuit can be arranged in a branched manner. Accordingly, the possibility that noise caused by the operation of the constant voltage output circuit is superimposed on the modulation signal is reduced and the possibility that noise caused by the operation of the modulation circuit is superimposed on the DC voltage signal is reduced. That is, the possibility that the accuracy of the modulation signal and the DC voltage signal decreases is reduced. Therefore, the stability of the operation of the integrated circuit in which the input terminal, the modulation circuit, and the constant voltage output circuit are arranged is improved so that the possibility that the accuracy of the modulation signal and the DC voltage signal decreases is reduced.

According to still another aspect, there is provided an integrated circuit used in a drive circuit that outputs a drive signal for driving a capacitive load. The integrated circuit includes a modulation circuit that modulates a base drive signal to output a modulation signal, a switching circuit that outputs an amplification control signal according to the modulation signal, an input terminal to which a feedback signal based on the drive signal is input, and a constant voltage output circuit that outputs a DC voltage signal. The modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

According to the integrated circuit, the first virtual line segment located between the input terminal and the constant voltage output circuit in the first virtual straight line connecting the input terminal and the constant voltage output circuit at the shortest distance does not intersect the modulation circuit, and the second virtual line segment located between the input terminal and the modulation circuit in the second virtual straight line connecting the input terminal and the modulation circuit at the shortest distance does not intersect the constant voltage output circuit. With the configuration, the wiring through which the DC voltage signal is propagated from the constant voltage output circuit to the input terminal and the wiring through which the feedback signal is propagated from the input terminal to the modulation circuit can be arranged in a branched manner. Accordingly, the possibility that noise caused by the operation of the constant voltage output circuit is superimposed on the modulation signal is reduced and the possibility that noise caused by the operation of the modulation circuit is superimposed on the DC voltage signal is reduced. That is, the possibility that the accuracy of the modulation signal and the DC voltage signal decreases is reduced. Therefore, the stability of the operation of the integrated circuit in which the input terminal, the modulation circuit, and the constant voltage output circuit are arranged is improved so that the possibility that the accuracy of the modulation signal and the DC voltage signal decreases is reduced.

What is claimed is:

1. A liquid ejecting apparatus comprising:
a liquid ejecting head having a drive element, and ejecting a liquid by supplying a drive signal to the drive element; and
a drive circuit that outputs the drive signal, wherein the drive circuit includes:
an integrated circuit that outputs an amplification control signal based on a base drive signal;

an amplifier circuit that operates according to the amplification control signal to output an amplified modulation signal;

a demodulation circuit that demodulates the amplified modulation signal to output the drive signal; and a feedback circuit that feeds back a feedback signal based on the drive signal to the integrated circuit, the integrated circuit includes:

a modulation circuit that modulates the base drive signal to output a modulation signal;

a switching circuit that outputs the amplification control signal according to the modulation signal;

a constant voltage output circuit that outputs a DC voltage signal; and an input terminal to which the feedback signal is input, the modulation circuit and the constant voltage output circuit are electrically coupled to the input terminal and the constant voltage output circuit is electrically connected between the modulation circuit and the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

2. The liquid ejecting apparatus according to claim 1, wherein the shortest distance between the input terminal and the modulation circuit is shorter than the shortest distance between the input terminal and the constant voltage output circuit.

3. The liquid ejecting apparatus according to claim 1, wherein the first virtual line segment does not intersect the switching circuit.

4. The liquid ejecting apparatus according to claim 1, wherein the second virtual line segment does not intersect the switching circuit.

5. A liquid ejecting apparatus comprising:

a liquid ejecting head having a drive element, and ejecting a liquid by supplying a drive signal to the drive element; and a drive circuit that outputs the drive signal, wherein the drive circuit includes:

an integrated circuit that outputs an amplification control signal based on a base drive signal;

an amplifier circuit that operates according to the amplification control signal to output an amplified modulation signal;

a demodulation circuit that demodulates the amplified modulation signal to output the drive signal; and a feedback circuit that feeds back a feedback signal based on the drive signal to the integrated circuit, the integrated circuit includes:

a modulation circuit that modulates the base drive signal to output a modulation signal;

a switching circuit that outputs the amplification control signal according to the modulation signal;

a constant voltage output circuit that outputs a DC voltage signal; and an input terminal to which the feedback signal is input, the input terminal being located between the modulation circuit and the constant voltage output circuit, the modulation circuit and the constant voltage output circuit are electrically coupled to the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

6. A drive circuit that outputs a drive signal for driving a capacitive load, the drive circuit comprising:

an integrated circuit that outputs an amplification control signal based on a base drive signal;

an amplifier circuit that operates according to the amplification control signal to output an amplified modulation signal;

a demodulation circuit that demodulates the amplified modulation signal to output the drive signal; and a feedback circuit that feeds back a feedback signal based on the drive signal to the integrated circuit, wherein the integrated circuit includes:

a modulation circuit that modulates the base drive signal to output a modulation signal;

a switching circuit that outputs the amplification control signal according to the modulation signal;

an input terminal to which the feedback signal is input; and a constant voltage output circuit that outputs a DC voltage signal, the modulation circuit and the constant voltage output circuit are electrically coupled to the input terminal and the constant voltage output circuit is electrically connected between the modulation circuit and the input terminal, a first virtual line segment located between the input terminal and the constant voltage output circuit in a first virtual straight line connecting the input terminal and the constant voltage output circuit at a shortest distance does not intersect the modulation circuit, and a second virtual line segment located between the input terminal and the modulation circuit in a second virtual straight line connecting the input terminal and the modulation circuit at a shortest distance does not intersect the constant voltage output circuit.

7. An integrated circuit used in a drive circuit that outputs a drive signal for driving a capacitive load, the integrated circuit comprising:

a modulation circuit that modulates a base drive signal to output a modulation signal;

a switching circuit that outputs an amplification control signal according to the modulation signal;

an input terminal to which a feedback signal based on the drive signal is input; and a constant voltage output circuit that outputs a DC voltage signal, wherein the modulation circuit and the constant voltage output circuit are electrically coupled to the input terminal and the constant voltage output circuit is electrically connected between the modulation circuit and the input terminal, a first virtual line segment located between the input terminal and the constant voltage output circuit in a first virtual straight line connecting the input terminal and the constant voltage output circuit at a shortest distance does not intersect the modulation circuit, and
a second virtual line segment located between the input terminal and the modulation circuit in a second virtual straight line connecting the input terminal and the modulation circuit at a shortest distance does not intersect the constant voltage output circuit.

* * * * *